United States Patent
Chistyakov

(10) Patent No.: US 7,345,429 B2
(45) Date of Patent: Mar. 18, 2008

(54) METHODS AND APPARATUS FOR GENERATING STRONGLY-IONIZED PLASMAS WITH IONIZATIONAL INSTABILITIES

(75) Inventor: Roman Chistyakov, Andover, MA (US)

(73) Assignee: Zond, Inc., Mansfield, MA (US)

( * ) Notice: Subject to any disclaimer, the term of this patent is extended or adjusted under 35 U.S.C. 154(b) by 0 days.

(21) Appl. No.: 11/376,036

(22) Filed: Mar. 15, 2006

(65) Prior Publication Data

US 2006/0175197 A1 Aug. 10, 2006

Related U.S. Application Data

(63) Continuation of application No. 10/708,281, filed on Feb. 22, 2004, now Pat. No. 7,095,179.

(51) Int. Cl.
*H01J 7/24* (2006.01)
(52) U.S. Cl. .............................. 315/111.21; 315/111.51; 204/298.31
(58) Field of Classification Search .......... 315/111.21, 315/111.31, 111.41, 111.51, 111.71; 204/298.08, 204/298.2, 298.31
See application file for complete search history.

(56) References Cited

U.S. PATENT DOCUMENTS

| | | | |
|---|---|---|---|
| 3,104,345 A | 9/1963 | Wilcox et al. | |
| 4,931,169 A | 6/1990 | Scherer et al. | |
| 5,002,631 A | 3/1991 | Giapis et al. | |
| 5,015,493 A | 5/1991 | Gruen | |
| 5,565,247 A | 10/1996 | Suzuki et al. | |
| 5,616,224 A | 4/1997 | Boiling | |
| 5,844,195 A | 12/1998 | Fairbairn et al. | |
| 6,124,675 A | 9/2000 | Bertrand et al. | |

(Continued)

FOREIGN PATENT DOCUMENTS

| | | |
|---|---|---|
| DE | 3700633 C1 | 5/1998 |
| EP | 1 260 603 A1 | 11/2002 |
| WO | 98/40532 | 9/1998 |
| WO | 02/103078 A1 | 12/2002 |

OTHER PUBLICATIONS

Kouznetsov, et al., A Novel Pulsed Magnetron Sputter Technique Utilizing Very High Target Power Densities, Surface and Coatings Technology, 1999, pp. 290-293, vol. 122, Elsevier.

(Continued)

*Primary Examiner*—David H. Vu
(74) *Attorney, Agent, or Firm*—Kurt Rauschenbach; Rauschenbach Patent Law Group, LLC

(57) ABSTRACT

Methods and apparatus for generating strongly-ionized plasmas are disclosed. A strongly-ionized plasma generator according to one embodiment includes a chamber for confining a feed gas. An anode and a cathode assembly are positioned inside the chamber. A pulsed power supply is electrically connected between the anode and the cathode assembly. The pulsed power supply generates a multi-stage voltage pulse that includes a low-power stage with a first peak voltage having a magnitude and a rise time that is sufficient to generate a weakly-ionized plasma from the feed gas. The multi-stage voltage pulse also includes a transient stage with a second peak voltage having a magnitude and a rise time that is sufficient to shift an electron energy distribution in the weakly-ionized plasma to higher energies that increase an ionization rate which results in a rapid increase in electron density and a formation of a strongly-ionized plasma.

14 Claims, 16 Drawing Sheets

U.S. PATENT DOCUMENTS

| | | | |
|---|---|---|---|
| 6,197,165 | B1 | 3/2001 | Drewery et al. |
| 6,222,321 | B1 | 4/2001 | Scholl et al. |
| 6,254,745 | B1 | 7/2001 | Vukovic |
| 6,296,742 | B1 | 10/2001 | Kouznetsov |
| 6,327,163 | B1 | 12/2001 | Petr |
| 6,342,132 | B1 | 1/2002 | Rossnagel |
| 6,355,992 | B1 | 3/2002 | Via |
| 6,359,424 | B2 | 3/2002 | Iida et al. |
| 6,413,382 | B1 | 7/2002 | Wang et al. |
| 6,416,634 | B1 | 7/2002 | Mostovoy et al. |
| 6,633,017 | B1 | 10/2003 | Drummond et al. |
| 6,805,779 | B2 | 10/2004 | Chistyakov |
| 6,806,651 | B1 | 10/2004 | Chistyakov |
| 6,806,652 | B1 | 10/2004 | Chistyakov |
| 6,808,607 | B2 | 10/2004 | Christie |
| 6,853,142 | B2 | 2/2005 | Chistyakov |
| 6,896,773 | B2 | 5/2005 | Chistyakov |
| 6,896,775 | B2 | 5/2005 | Chistyakov |
| 6,903,511 | B2 | 6/2005 | Chistyakov |
| 2004/0020760 | A1 | 2/2004 | Kouznetsov |
| 2004/0060813 | A1 | 4/2004 | Chistyakov |
| 2004/0086434 | A1 | 5/2004 | Gadgil et al. |
| 2004/0094411 | A1 | 5/2004 | Chistyakov |
| 2005/0092596 | A1 | 5/2005 | Kouznetsov |
| 2005/0103620 | A1 | 5/2005 | Chistyakov |
| 2005/0109607 | A1 | 5/2005 | Ehiasarian et al. |
| 2005/0173239 | A1 | 8/2005 | Somekh et al. |

OTHER PUBLICATIONS

Steinbruchel, A Simple Formula For Low-Energy Sputtering Yields, Applied Physics A., 1985, pp. 37-42, vol. 36, Springer, Verlag.

Daugherty, et al., Attachment-Dominated Electron-Beam-Ionized Discharges, Applied Physics Letters, May 15, 1976, pp. 581-583, vol. 28, No. 10, American Institute of Physics.

Fajans, et al., Bifurcations in Elliptical, Asymmetric Non-Neutral Plasmas, Physics of Plasmas, Oct. 2000, pp. 3929-3933, vol. 7, No. 10, American Institute of Physics.

Dekoven, et al., Carbon Thin Film Deposition Using High Power Pulsed Magnetron Sputtering, 46th Annual Technical Conference Proceedings, 2003, pp. 158-165, Society of Vacuum Coaters.

Choueiri, Characterization Of Oscillations In Closed Drift Thrusters, pp. 1-19.

Stark, et al., Electron Heating in Atmospheric Pressure Glow Discharges, Journal of Applied Physics, Apr. 2001, p. 3568, vol. 89, No. 7, American Institute of Physics.

Gudmundsson, et al., Evolution Of The Electron Energy Distribution And Plasma Parameters In A Pulsed Magnetron Discharge, Applied Physics Letters, May 28, 2001, pp. 3427-3429, American Institute of Physics.

Tian, et al., Experimental Investigation Of The Electrical Characteristics And Initiation Dynamics Of Pulsed High-Voltage Glow Discharge, Journal of Physics D: Applied Physics, vol. 34, pp. 354-359, IOP Publishing Ltd., UK.

Mozgrin, et al., High-Current Low-Pressure Quasi -Stationary Discharge In A Magnetic Field: Experimental Research, Plasma Physics Reports, 1995, vol. 21, No. 5, pp. 400-409, Interperiodica Publishing.

Garrigues, et al., Hybrid And Particle-In-Cell Models Of A Stationary Plasma Thruster, Plasma Sources Sci. Technol., 2000, pp. 219-226, vol. 9, IOP Publishing Ltd., UK.

Kudryavtsev, et al., Ionization Relaxation In A Plasma Produced By A Pulsed Inert-Gas Discharge, Sov. Phys. Tech. Phys., Jan. 1983, pp. 30-35, vol. 28, No. 1, American Institute of Physcis.

Biberman, et al., Low-Temperature Plasmas With Nonequilibrium Ionization, Sov. Phys. Usp., Jun. 1979, pp. 411-432, vol. 22, No. 6.

Thornton, Magnetron Sputtering: Basic Physics And Application To Cylindrical Magnetrons, J. Vac. Sci. Technol. Mar./Apr. 1978, pp. 171-177, vol. 15, No. 2.

Helmersson, Metallization By Pulsed High-Power Sputtering, [online]. [retrieved on Nov. 21, 2003]. Retrieved from WWW.inf.liu.se/thinprogram/projects/p2.html.

Pisarev, Modification Of The Surface Of Perforated Polymer MF-4SK In Low-Pressure, High Current Quasi-Stable Discharge Plasma In Magnetic Field, [online]. [retrieved on Dec. 30, 2003]. Retrieved from WWW.tech-db.ru/lstc/db/pra.nsf/we/0624.

Gudmundsson, et al., Observation Of Ion-Acoustic Solitons In A Pulsed Magnetron Sputtering Discharge, 56th-Gaseous Electronics Conference-2003, Oct. 24, 2003, pp. 1-14.

Matossian, et al., Operating Characteristics Of A 100kv, 100kW Plasma Ion Implantation Facility, Surface Coatings & Technology, 1996, pp. 92-97, vol. 85.

Fajans, et al., Second Harmonic Autoresonant Control Of The I=1 Diocotron Mode In Pure-Electron Plasmas, Physical Review E, Sep. 2000, pp. 4131-4136, vol. 62, No. 3.

J.T. Gudmundsson, et al., Spatial And Temporal Behavior Of The Plasma Parameters In A Pulsed Magnetron Discharge, Surface & Coatings Technology, 2002, pp. 249-256, vol. 161, Elsevier Science.

Biberman, et al., Chapter Eight: Transient Nonequilibrium Plasmas, Kinetics Of Nonequilibrium Low Temperature Plasmas, 1987, pp. 321, 360-372, Plenum Publishing Corporation, New York, USA.

Gudmundsson, et al., Observation Of Solitons In A Pulsed Magnetron Sputtering Discharge [online]. [retrieved on Dec. 8, 2003]. Retrieved from WWW.eps.org/aps/meet/GEC03/baps/abs/s300.html.

The State Of The Art In Pulsed High Power [online]. [retrieved on Jul. 15, 2002]. Retrieved from WWW.physiqueindustrie.com/_pulse_power.html.

Encyclopedia Of Low Temperature Plasma, Editor V.E. Fortov, 2000, vol. 3, p. 123.

Encyclopedia Of Low Temperature Plasma, Editor V.E. Fortov, 2000, vol. 3, p. 119.

Hart, et al., Growth Of Soliton-like Structures From Normal Modes And Particle Loss From A Nonneutral Plasma, [online]. Non-Neutral Plasmas, Archibald/Cochran, 3rd Floor, Tower, Nov. 7, 1995.

Vladimirov, V., Voltage-Current Characteristics Of A Gas Magnetron In the Case Of Intense Cathode Sputtering, Sov. J. Plasma Phys., Jan.-Feb. 1981, pp. 114-118, vol. 7, No. 1.

Lutsenko, E.I., Instability Mechanisms In A High-Current Straight Discharge At A Low Gas Pressure, Sov. J. Plasma Phys., Jan.-Feb. 1984, pp. 87-95, vol. 10, No. 1.

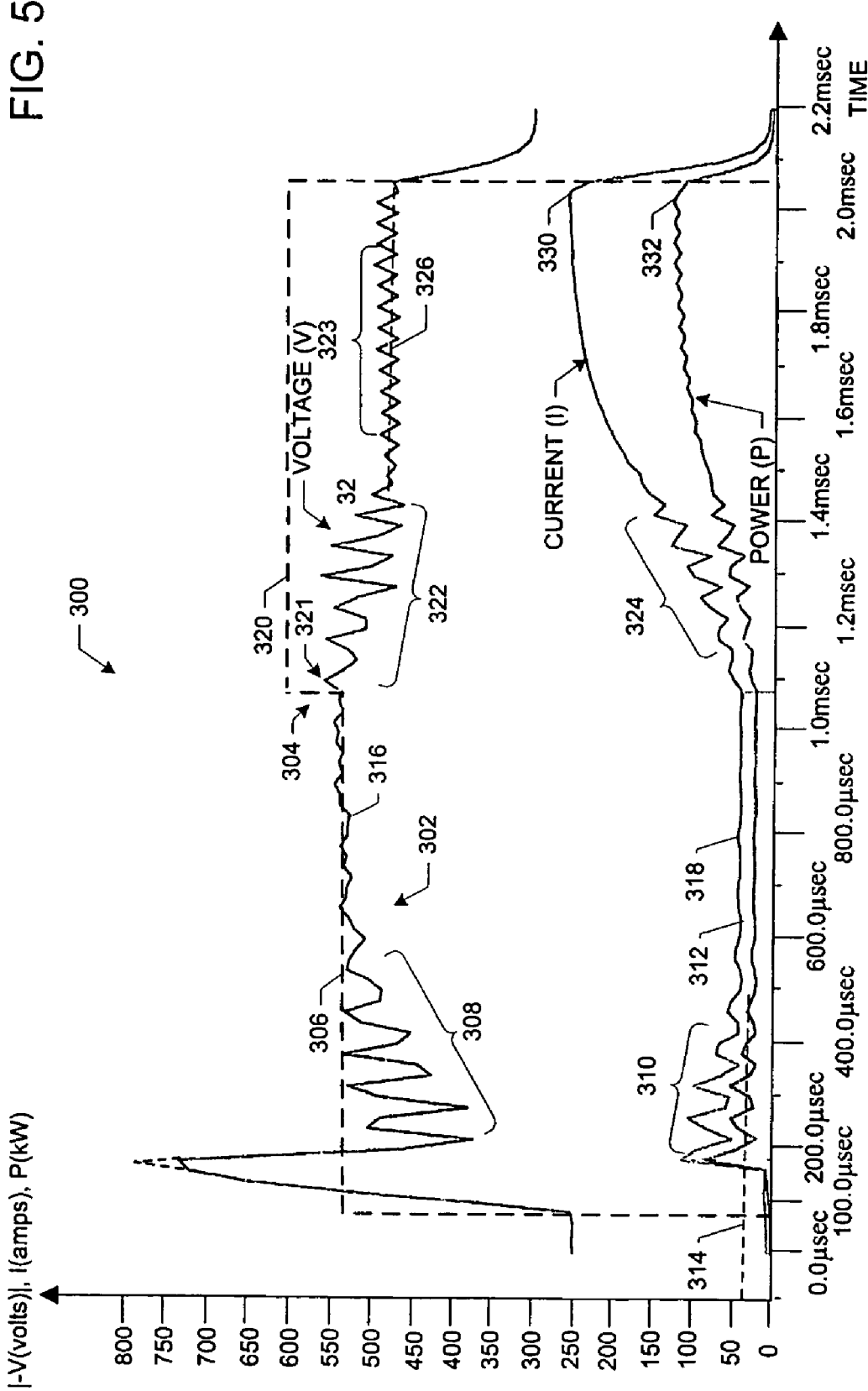

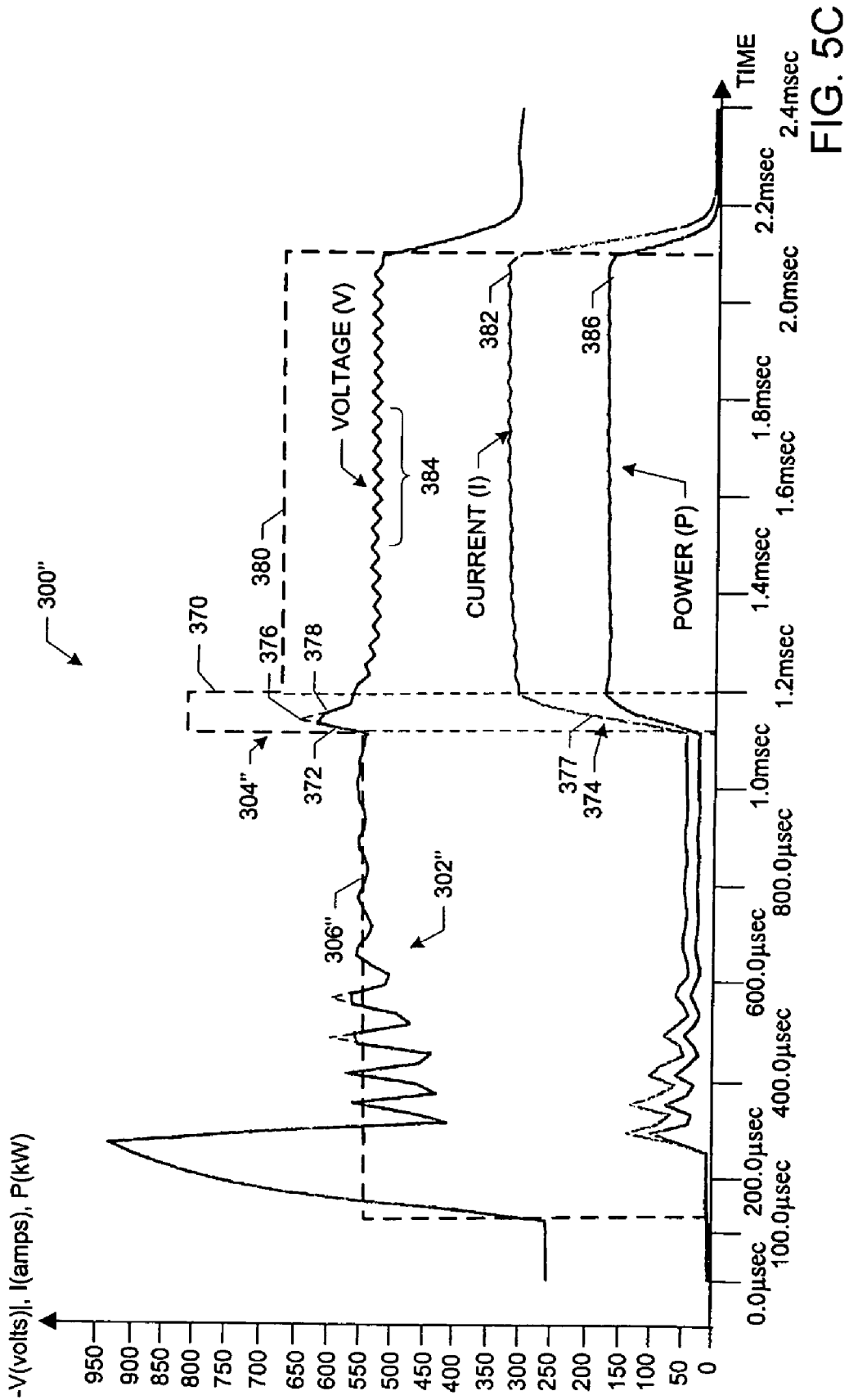

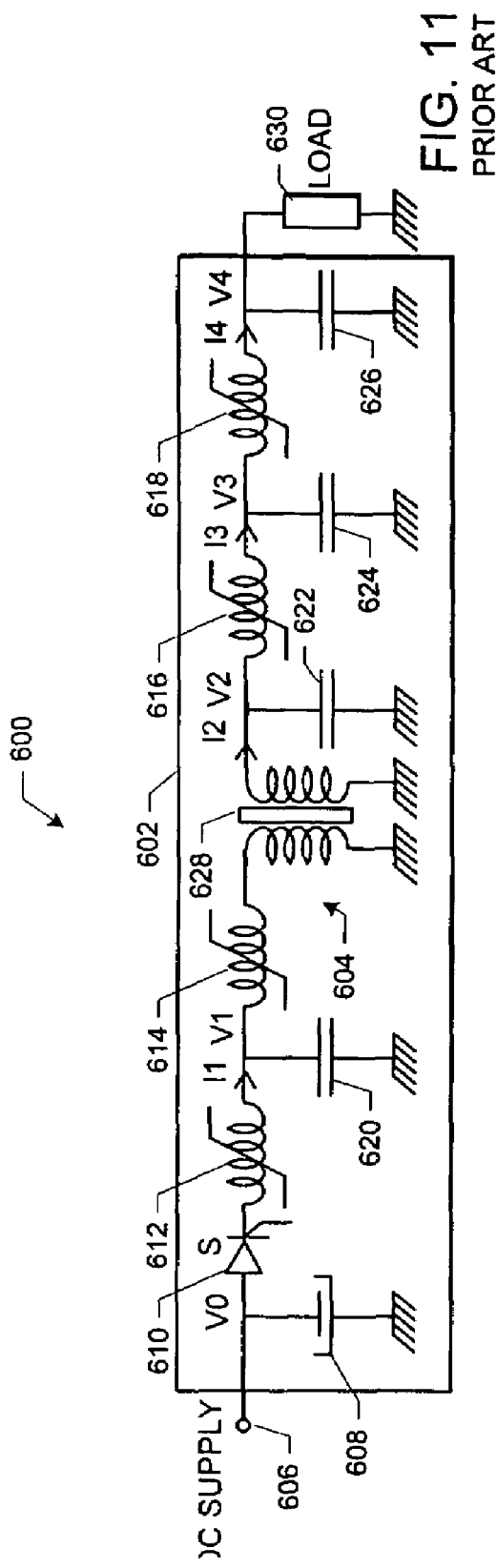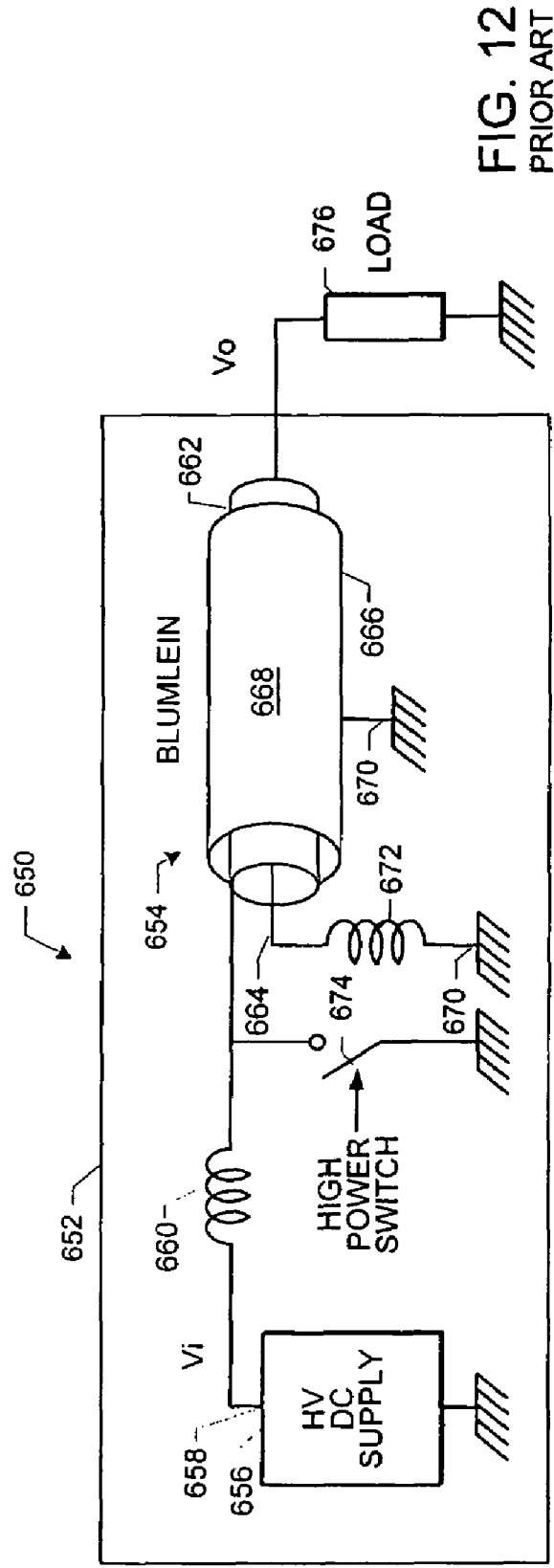
FIG. 11 PRIOR ART
FIG. 12 PRIOR ART

US 7,345,429 B2

METHODS AND APPARATUS FOR GENERATING STRONGLY-IONIZED PLASMAS WITH IONIZATIONAL INSTABILITIES

RELATED APPLICATION SECTION

This application is a continuation application of U.S. Ser. No. 10/708,281 filed Feb. 22, 2004 now U.S. Pat. No. 7,095,179, issued on Aug. 22, 2006, entitled "Methods and Apparatus for Generating Strongly Ionized Plasmas with Ionizational Instabilities," the entire application of which is incorporated herein by reference.

BACKGROUND OF INVENTION

A plasma can be created in a chamber by igniting a direct current (DC) electrical discharge between two electrodes in the presence of a feed gas. The electrical discharge generates electrons in the feed gas that ionize atoms thereby creating the plasma. The electrons in the plasma provide a path for an electric current to pass through the plasma. The energy supplied to the plasma must be relatively high for applications, such as magnetron plasma sputtering. Applying high electrical currents through a plasma can result in overheating the electrodes as well as overheating the work piece in the chamber. Complex cooling mechanisms can be used to cool the electrodes and the work piece. However, the cooling can cause temperature gradients in the chamber. These temperature gradients can cause non-uniformities in the plasma density which can cause non-uniform plasma process.

Temperature gradients can be reduced by pulsing DC power to the electrodes. Pulsing the DC power can allow the use of lower average power. This results in a lower temperature plasma process. However, pulsed DC power systems are prone to arcing at plasma ignition and plasma termination, especially when working with high-power pulses. Arcing can result in the release of undesirable particles in the chamber that can contaminate the work piece.

Plasma density in known plasma systems is typically increased by increasing the electrode voltage. The increased electrode voltage increases the discharge current and thus the plasma density. However, the electrode voltage is limited in many applications because high electrode voltages can effect the properties of films being deposited or etched. In addition, high electrode voltages can also cause arcing which can damage the electrode and contaminate the work piece.

BRIEF DESCRIPTION OF DRAWINGS

This invention is described with particularity in the detailed description and claims. The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

FIG. 5A-FIG. 5C are measured data of other illustrative multi-stage voltage pulses generated by the pulsed power supply of FIG. 1.

FIG. 11 illustrates a schematic diagram of a pulsed power supply having a magnetic compression network for supplying high-power pulses.

FIG. 12 illustrates a schematic diagram of a pulsed power supply having a Blumlein generator for supplying high-power pulses.

DETAILED DESCRIPTION

Figure 1:
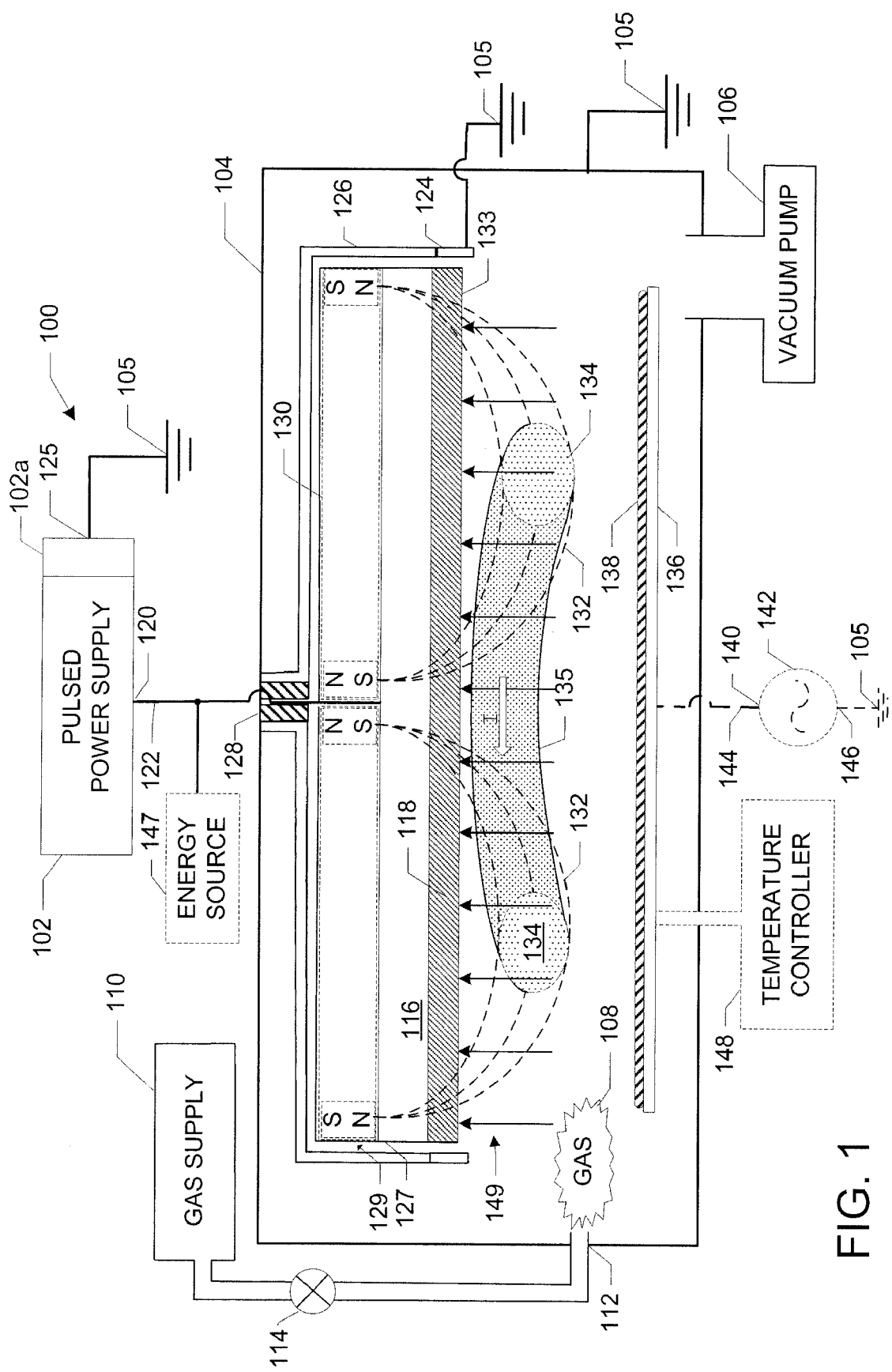
FIG. 1 illustrates a cross-sectional view of a plasma sputtering apparatus having a pulsed direct current (DC) power supply according to one embodiment of the invention.

FIG. 1 illustrates a cross-sectional view of a plasma sputtering apparatus 100 having a pulsed direct current (DC) power supply 102 according to one embodiment of the invention. The plasma sputtering apparatus 100 includes a vacuum chamber 104 for containing a plasma. The vacuum chamber 104 can be coupled to ground 105. The vacuum chamber 104 is positioned in fluid communication with a vacuum pump 106 that is used to evacuate the vacuum chamber 104 to high vacuum. The pressure inside the vacuum chamber 104 is generally less than $10^{-1}$ Torr for most plasma operating conditions. A process or feed gas 108 is introduced into the vacuum chamber 104 through a gas inlet 112 from a feed gas source 110, such as an argon gas source. The flow of the feed gas is controlled by a valve 114. In some embodiments, the gas source is an excited atom or metastable atom source.

The plasma sputtering apparatus 100 also includes a cathode assembly 116. The cathode assembly 116 shown in FIG. 1 is formed in the shape of a circular disk, but can be formed in other shapes. In some embodiments, the cathode assembly 116 includes a target 118 for sputtering. The cathode assembly 116 is electrically connected to a first terminal 120 of the pulsed power supply 102 with an electrical transmission line 122.

A ring-shaped anode 124 is positioned in the vacuum chamber 104 proximate to the cathode assembly 116. The anode 124 is electrically connected to ground 105. A second terminal 125 of the pulsed power supply 102 is also electrically connected to ground 105. In other embodiments, the anode 124 is electrically connected to the second terminal 125 of the pulsed power supply 102 which is not at ground potential.

A housing 126 surrounds the cathode assembly 116. The anode 124 can be integrated with or electrically connected to the housing 126. The outer edge 127 of the cathode assembly 116 is electrically isolated from the housing 126 with insulators 128. The gap 129 between the outer edge 127 of the cathode assembly 116 and the housing 126 can be an air gap or can include a dielectric material.

In some embodiments, the plasma sputtering apparatus 100 includes a magnet assembly 130 that generates a magnetic field 132 proximate to the target 118. The magnetic field 132 is less parallel to the surface of the cathode assembly 116 at the poles of the magnets in the magnet assembly 130 and more parallel to the surface of the cathode assembly 116 in the region 134 between the poles of the magnets in the magnetic assembly 130. The magnetic field 132 is shaped to trap and concentrate secondary electrons emitted from the target 118 that are proximate to the target surface 133. The magnet assembly can consist of rotating magnets.

The magnetic field 132 increases the density of electrons and therefore, increases the plasma density in the region 134 that is proximate to the target surface 133. The magnetic field 132 can also induce an electron Hall current 135 that is formed by the crossed electric and magnetic fields. The strength of the electron Hall current 135 depends, at least in part, on the density of the plasma and the strength of the crossed electric and magnetic fields.

The plasma sputtering apparatus 100 also includes a substrate support 136 that holds a substrate 138 or other work piece for plasma processing. In some embodiments, the substrate support 136 is biased with a RF field. In these embodiments, the substrate support 136 is electrically connected to an output 140 of a RF power supply 142 with an electrical transmission line 144. A matching network (not shown) may be used to coupled the RF power supply 142 to the substrate support 136. In some embodiments, a temperature controller 148 is thermally coupled to the substrate support 136. The temperature controller 148 regulates the temperature of the substrate 138.

In some embodiments, the plasma sputtering apparatus 100 includes an energy storage device 147 that provides a source of energy that can be controllably released into the plasma. The energy storage device 147 is electrically coupled to the cathode assembly 116. In one embodiment, the energy storage device 147 includes a capacitor bank.

In operation, the vacuum pump 106 evacuates the chamber 104 to the desired operating pressure. The feed gas source 110 injects feed gas 108 into the chamber 104 through the gas inlet 112. The pulsed power supply 102 applies voltage pulses to the cathode assembly 116 that cause an electric field 149 to develop between the target 118 and the anode 124. The magnitude, duration and rise time of the initial voltage pulse are chosen such that the resulting electric field 149 ionizes the feed gas 108, thus igniting the plasma in the chamber 104.

In one embodiment, ignition of the plasma is enhanced by one or more methods described in co-pending U.S. patent application Ser. No. 10/065,277, entitled High-Power Pulsed Magnetron Sputtering, and co-pending U.S. patent application Ser. No. 10/065,629, entitled Methods and Apparatus for Generating High-Density Plasma which are assigned to the present assignee. The entire disclosures of U.S. patent application Ser. No. 10/065,277 and U.S. patent application Ser. No. 10/065,629 are incorporated herein by reference. U.S. patent application Ser. No. 10/065,629 describes a method of accelerating the ignition of the plasma by increasing the feed gas pressure for a short period of time and/or flowing feed gas directly through a gap between an anode and a cathode assembly. In addition, U.S. patent application Ser. No. 10/065,277 describes a method of using pre-ionization electrodes to accelerate the ignition of the plasma.

The characteristics of the voltage pulses generated by the pulsed power supply 102 and the resulting plasmas are discussed in connection with the following figures. The pulsed power supply 102 can include circuitry 102a that minimizes or eliminates the probability of arcing in the chamber 104. Arcing is generally undesirable because it can damage the anode 124 and cathode assembly 116 and can contaminate the wafer or work piece being processed. In one embodiment, the circuitry of the pulse supply 102 limits the plasma discharge current up to a certain level, and if this limit is exceeded, the voltage generated by the power supply 102 drops for a certain period of time.

The plasma is maintained by electrons generated by the electric field 149 and also by secondary electron emission from the target 118. In embodiments including the magnet assembly 130, the magnetic field 132 is generated proximate to the target surface 133. The magnetic field 132 confines the primary and secondary electrons in a region 134 thereby concentrating the plasma in the region 134. The magnetic field 132 also induces the electron Hall current 135 proximate to the target surface 133 that further confines the plasma in the region 134.

In one embodiment, the magnet assembly 130 includes an electromagnet in addition to a permanent magnet. A magnet power supply (not shown) is electrically connected to the magnetic assembly 130. The magnet power supply can generate a constant current that generates a constant magnetic filed. Alternatively, the magnet power supply can generate a pulse that produces a pulsed magnetic field that creates an increase in electron Hall current 135 proximate to the target surface 133 that further confines the plasma in the region 134. In one embodiment, the pulsing of the magnetic field is synchronized with the pulsing the electric field in the plasma discharge in order to increase the density of the plasma. The sudden increase in the electron Hall current 135 may create a transient non-steady state plasma.

Ions in the plasma bombard the target surface 133 because the target 118 is negatively biased. The impact caused by the ions bombarding the target surface 133 dislodges or sputters material from the target 118. The sputtering rate generally increases as the density of the plasma increases.

The RF power supply 142 can apply a negative RF bias voltage to the substrate 138 that attracts positively ionized sputtered material to the substrate 138. The sputtered material forms a film of target material on the substrate 138. The magnitude of the RF bias voltage on the substrate 138 can be chosen to optimize parameters, such as sputtering rate and adhesion of the sputtered film to the substrate 138. The magnitude of the RF bias voltage on the substrate 138 can also be chosen to minimize damage to the substrate 138. In embodiments including the temperature controller 148, the temperature of the substrate 138 can be regulated by the temperature controller 148 in order to avoid overheating the substrate 138.

Although FIG. 1 illustrates a cross-sectional view of a plasma sputtering apparatus 100, it will be clear to skilled artisans that the principles of the present invention can be used in many other systems, such as plasma etching systems, hollow cathode magnetrons, ion beam generators, plasma-enhanced chemical vapor deposition (CVD) systems, plasma accelerators, plasma rocket thrusters, plasma traps, and any plasma system that uses crossed electric and magnetic fields.

Figure 2:
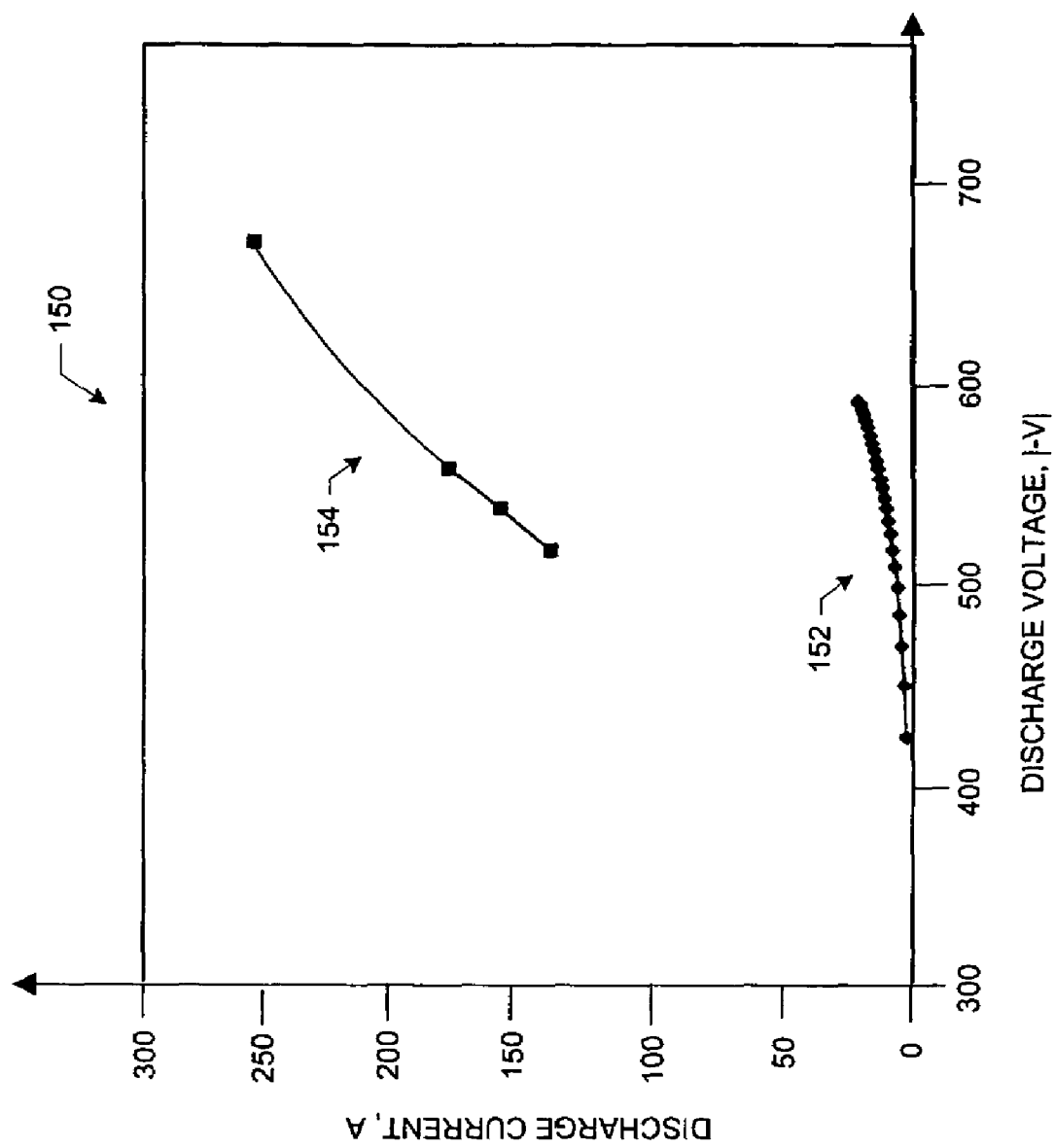
FIG. 2 is measured data of discharge voltage as a function of discharge current for a prior art low-current plasma and a high-current plasma according to the present invention.

FIG. 2 is measured data 150 of discharge voltage as a function of discharge current for a prior art low-current plasma and a high-current plasma according to the present invention. Current-voltage characteristic 152 represents measured data for discharge voltage as a function of discharge current for a plasma generated in a typical commercial magnetron plasma system with a commercially available DC power supply. The actual magnetron plasma system used to obtain the current-voltage characteristics 152 was a standard magnetron with a 10 cm diameter copper sputtering target. Similar results have been observed for a NiV sputtering target. Argon was used as the feed gas and the operating pressure was about 1 m Torr. The current-voltage characteristic 152 illustrates that discharge current increases with voltage.

The current-voltage characteristic 152 for the same magnetron plasma system generates a relatively low or moderate plasma density (less than $10^{12}$-$10^{13}$ cm$^{-3}$, measured close to the cathode/target surface) in a low-current regime. The plasma density in the low-current regime is relatively low because the plasma is mainly generated by direct ionization of ground state atoms in the feed gas. The term "low-current regime" is defined herein to mean the range of plasma discharge current densities that are less than about 0.5 A/cm$^2$ for typical sputtering voltages of between about −300V to −1000V. The power density is less than about 250 W/cm$^2$ for plasmas in the low-current regime. Sputtering with discharge voltages greater than −800V can be undesirable because such high voltages can increase the probability of arcing and can tend to create sputtered films having relatively poor film quality.

The current-voltage characteristic 154 represents actual data for a plasma generated by the pulsed power supply 102 in the plasma sputtering system 100 of FIG. 1. The current-voltage characteristic 154 illustrates that the discharge current is about 140 A(~1.8 A/cm$^2$) at a voltage of about −500V. The discharge current is about 220 A(~2.7 A/cm$^2$) when the voltage is about −575V. The data depends on various parameters, such as the magnitude and geometry of the magnetic field, chamber pressure, gas flow rate, pumping speed, and the design of the pulsed power supply 102. For certain operating conditions, the discharge current can exceed 375 A with a discharge voltage of only −500V.

The voltage-current characteristic 154 is in a high-current regime. The current-voltage characteristic 154 generates a relatively high plasma density (greater than $10^{12}$-$10^{13}$ cm$^{-3}$) in the high-current regime. The term "high-current regime" is defined herein to mean the range of plasma discharge currents that are greater than about 0.5 A/cm$^2$ for typical sputtering voltages of between about −300V to −1000V. The power density is greater than about 250 W/cm$^2$ for plasmas in the high-current regime. The voltage-current characteristic 154 generates high-density plasmas that can be used for high-deposition rate magnetron sputtering.

Some known magnetron systems operate within the high-current regime for very short periods of time. However, these known magnetron systems cannot sustain and control operation in the high-current regime for long enough periods of time to perform any useful plasma processing. The pulsed power supply 102 of the present invention is designed to generate waveforms that create and sustain the high-density plasma with current-voltage characteristics in the high-current regime.

Figure 3:
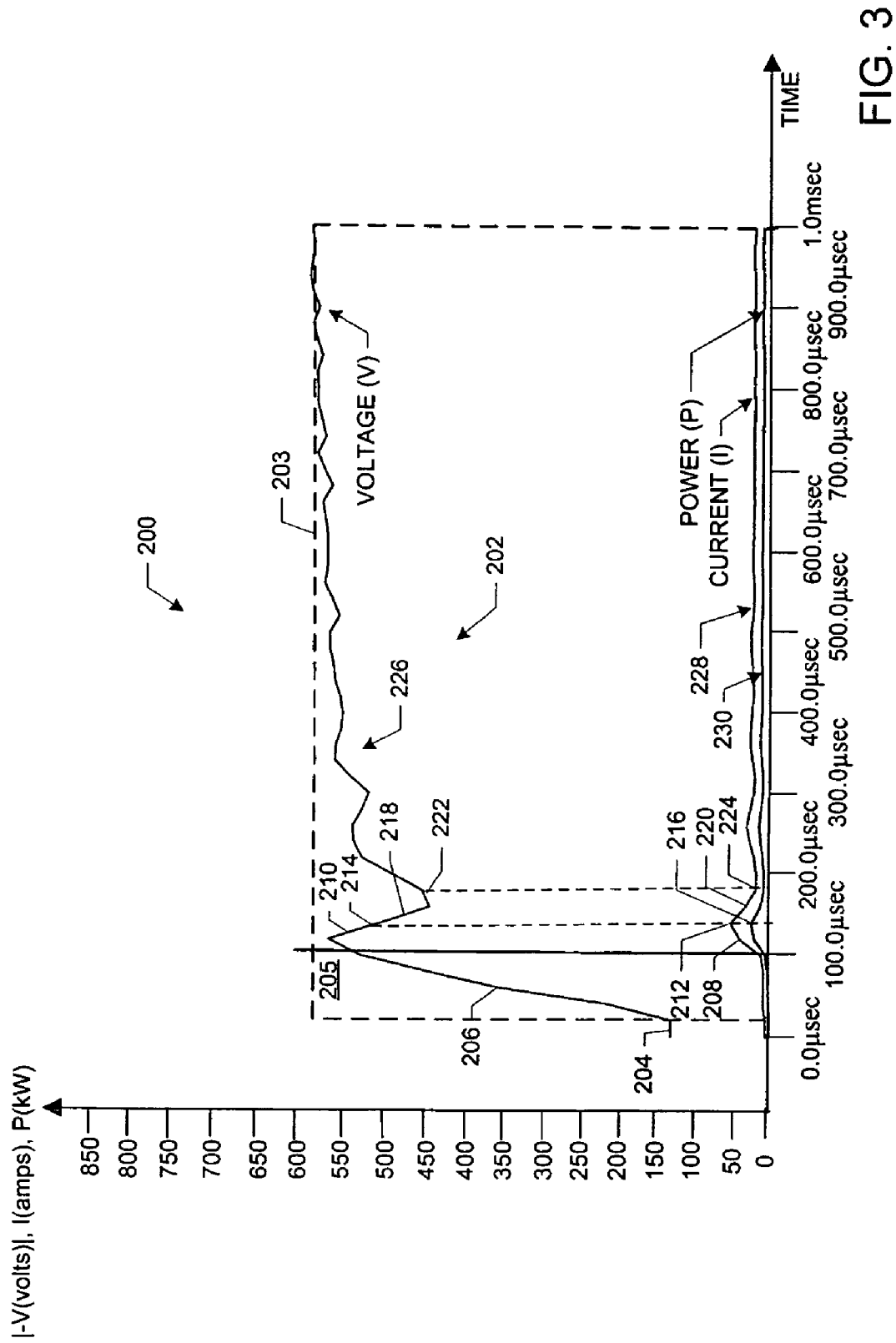
FIG. 3 is measured data of a particular voltage pulse generated by the pulsed power supply of FIG. 1 operating in a low-power voltage mode.

FIG. 3 is measured data 200 of a particular voltage pulse 202 generated by the pulsed power supply 102 of FIG. 1 operating in a low-power voltage mode. The pulsed power supply 102 produces a weakly-ionized plasma having a low or moderate plasma density (less than $10^{12}$ $10^{13}$ cm$^{-3}$) that is typical of known plasma processing systems. The pulsed power supply 102 is operating in a low-power mode throughout the duration of the voltage pulse 202. The pulsed power supply 102 supplies energy to the plasma at a relatively slow rate in the low-power mode. The energy supplied by the pulsed power supply 102 in the low-power mode generates a weakly-ionized plasma by direct ionization of the ground state atoms in the feed gas. The weakly-ionized plasma corresponds to a plasma generated by a conventional DC magnetron.

The pulsed power supply 102 can be programmed to generate voltage pulses having various shapes. The desired voltage pulse of FIG. 3 is a square wave voltage pulse as shown by the dotted line 203. However, the actual voltage pulse 202 generated by the pulsed power supply 102 is not perfectly square, but instead includes low frequency oscillations that are inherent to the power supply 102. Some of these low frequency oscillations can be on the order of 50V or more. In addition, the voltage pulse 202 has an initial value 204 of about −115V that is caused by the charge accumulation on the cathode assembly 116 for a particular repetition rate.

The voltage pulse 202 includes an ignition stage 205 that is characterized by a voltage 206 having a magnitude and a rise time that is sufficient to ignite a plasma from a feed gas. The magnitude of the voltage pulse 202 rises to about 550V in the ignition stage 205. However, the voltage of the first pulse that initially ignites the plasma can be as high as −1500V. The ignition of the plasma is depicted as a rise in a discharge current 208 through the plasma. The duration of the ignition stage 205 is generally less than about 150 μsec. After the ignition stage 205, the discharge current 208 continues to rise even as the voltage 210 decreases.

The rise in the discharge current 208 is caused at least in part by the interaction of the pulsed power supply 102 with the developing plasma. The impedance of the plasma decreases as the current density in the plasma increases. The pulsed power supply 102 attempts to maintain a constant voltage, but the voltage decreases due to the changing plasma resistive load. The peak discharge current 212 is less than about 50 A with a voltage 214 that is about −450V. The power 216 that is present at the peak discharge current 212, which corresponds to a momentary peak density of the plasma, is about 23 kW.

As the voltage 218 continues to decrease, the discharge current 220 and the plasma density also decrease. As the density of the plasma decreases, the impedance of the plasma increases. The voltage level 222 corresponds to a quasi-static discharge current 224 that is substantially constant throughout the duration of the voltage pulse 202. This region of quasi-static discharge current 224 is caused by the plasma having a substantially constant resistive load. The term "substantially constant" when applied to discharge current is defined herein to mean a discharge current with less than a 10% variation.

After about 200 μsec the oscillations dampen as the voltage 226 fluctuates between about −525V and −575V, the discharge current 228 remains constant with a value of about 25A and the power 230 is between about 10-15 kW. These conditions correspond to a weakly-ionized or low-density plasma that is typical of most plasma processing systems, such as the conditions represented by the current-voltage characteristic 152 described in connection with FIG. 2. The plasma density is in the range of about $10^8$-$10^{13}$ cm$^{-3}$.

The total duration of the voltage pulse 202 is about 1.0 m sec. The next voltage pulse (not shown) will typically include an ignition stage 205 in order to re-ignite the plasma. However, electrons generated from the first pulse can still be present so the required ignition voltage will typically be much less than the first pulse (on the order of about −600V) and the ignition will typically be much faster (on the order of less than about 200 μsec).

Figure 4:
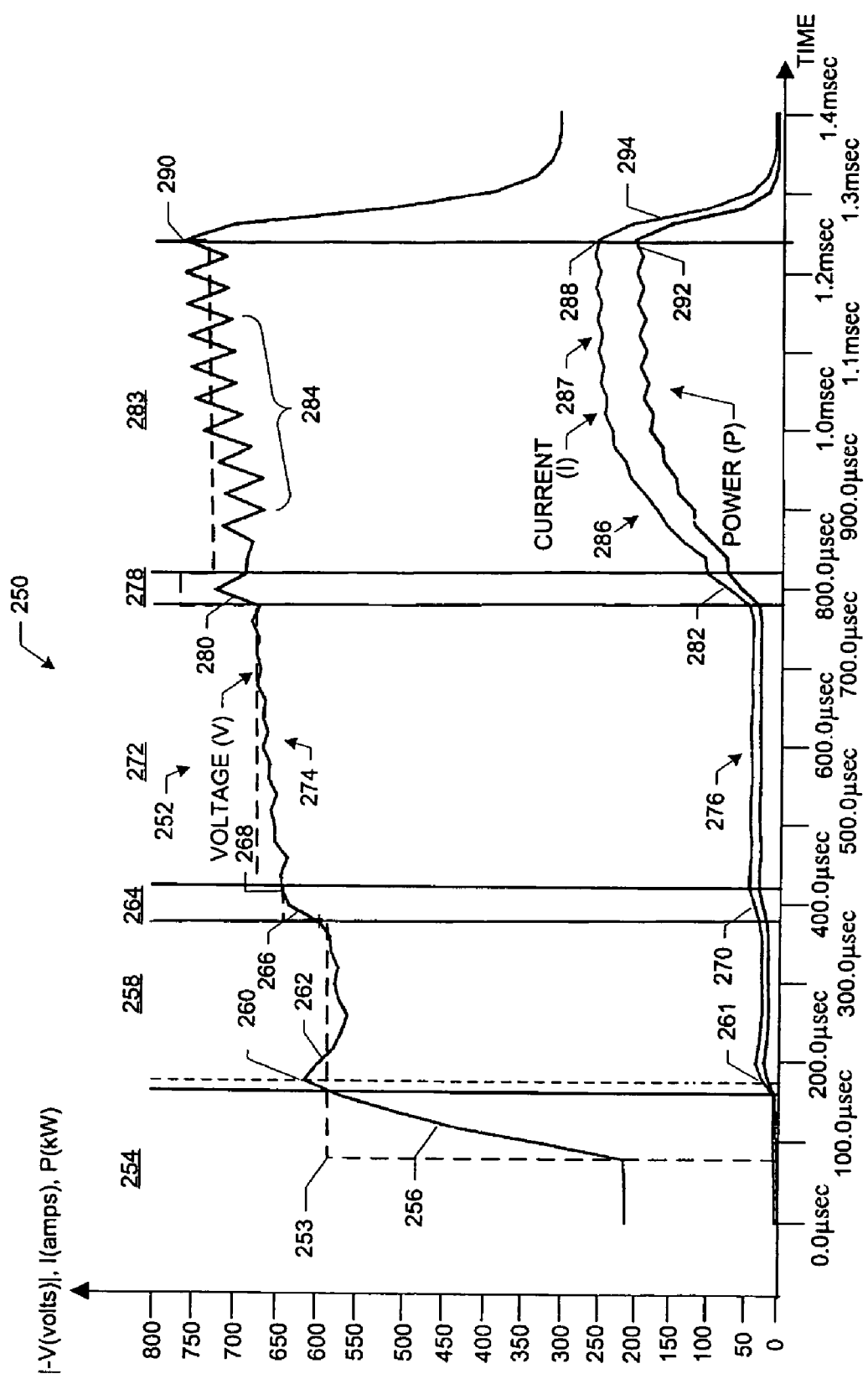
FIG. 4 is measured data of a multi-stage voltage pulse that is generated by the pulsed power supply of FIG. 1 that creates a strongly-ionized plasma according to the present invention.

FIG. 4 is measured data 250 of a multi-stage voltage pulse 252 that is generated by the pulsed power supply of FIG. 1 that creates a strongly-ionized plasma according to the present invention. The measured data 250 is from a magnetron sputtering system that includes a 10 cm diameter NiV target with an argon feed gas at a pressure of about $10^{-3}$ Torr. The multi-stage voltage pulse 252 generates a weakly-ionized plasma in the low-current regime (FIG. 2) initially, and then eventually generates a strongly-ionized or high-density plasma in the high-current regime according to the present invention. Weakly-ionized plasmas are generally plasmas having plasma densities that are less than about $10^{12}$-$10^{13}$ cm$^{-3}$ and strongly-ionized plasmas are generally plasmas having plasma densities that are greater than about $10^{12}$-$10^{13}$ cm$^{-3}$. The multi-stage voltage pulse 252 is presented to illustrate the present invention. One skilled in the art will appreciate that there are numerous variations of the exact shape of the multi-stage pulse according to the present invention.

The multi-stage voltage pulse 252 is a single voltage pulse having multiple stages as illustrated by the dotted line 253. An ignition stage 254 of the voltage pulse 252 corresponds to a voltage 256 having a magnitude on the order of about −600V) and a rise time (on the order of about 4V/μsec) that is sufficient to ignite an initial plasma from a feed gas. The initial plasma is typically ignited in less than 200 μsec.

A first low-power stage 258 of the voltage pulse 252 has a peak voltage 260 that corresponds to a discharge current 261 in the developing initial plasma. In some embodiments, the ignition stage 254 is integrated into the first low-power stage 258 such that the plasma is ignited during the first low-power stage 258. The peak voltage 260 is about −600V and can range from −300V to −1000V, the corresponding discharge current 261 is about 20 A, and the corresponding power is about 12 kW. In the first low-power stage 258, the pulsed power supply 102 (FIG. 1) is operating in the low-power mode. In the low power mode, the pulsed power supply 102 supplies energy to the initial plasma at a relatively slow rate. The slow rate of energy supplied to the initial plasma in the low-power mode maintains the plasma in a weakly-ionized condition.

The weakly-ionized or pre-ionized condition corresponds to an initial plasma having a relatively low (typically less than $10^{12}$-$10^{13}$ cm$^{-3}$) plasma density. As the density of the initial plasma grows, the voltage 262 decreases by about 50V as the current 261 continues to rise to about 30A before remaining substantially constant for about 200 μsec. The discharge current 261 rises as the voltage 262 decreases because of the changing impedance of the plasma. As the plasma density changes, the impedance of the plasma and thus the load seen by the pulsed power supply 102 also changes. In addition, the initial plasma can draw energy from the pulsed power supply 102 at a rate that is faster than the response time of the pulsed power supply 102 thereby causing the voltage 262 to decrease.

The impedance of the plasma decreases when the number of ions and electrons in the plasma increases as the current density in the initial plasma increases. The increase in the number of ions and electrons decreases the value of the plasma load. The pulsed power supply 102 attempts to maintain a constant voltage. However, the voltage 262 continues to decrease, at least in part, because of the changing plasma load. The substantially constant discharge current corresponds to a conventional DC magnetron discharge current as discussed in connection with current-voltage characteristic 152 of FIG. 2. The initial plasma can correspond to a plasma that is in a steady state or a quasi-steady state condition.

The peak plasma density can be controlled by controlling the slope of the rise time of the voltage pulse 252. In a first transient stage 264 of the voltage pulse 252, the voltage increase is characterized by a relatively slow rise time (on the order of about 2.8V/μsec) that is sufficient to only moderately increase the plasma density. The plasma density increases moderately because the magnitude and the rise time of the voltage 266 in the first transient stage 264 is not sufficient to energize the electrons in the plasma to significantly increase an electron energy distribution in the plasma. An increase in the electron energy distribution in the plasma can generate ionizational instabilities that rapidly increase the ionization rate of the plasma. The electron energy distribution and the ionizational instabilities are discussed in more detail with respect to generating a strongly-ionized plasma according to the invention.

The moderate increase in the plasma density will result in a current-voltage characteristic that is similar to the current-voltage characteristic 152 of a conventional DC magnetron that was described in connection with FIG. 2. The voltage 266 increases by about 50V to a voltage peak 268 of about −650V. The discharge current 270 increases by about 20 A to about 50 A and the power increases to about 30 kW. The pulsed power supply 102 is still operating in the low-power mode during the first transient stage 264.

In a second low-power stage 272 of the voltage pulse 252, the voltage 274 increases slowly by about 40V. The slow voltage increase is characterized by a discharge current 276 that remains substantially constant for about 350 μsec. The plasma can be substantially in a steady state or a quasi-steady state condition corresponding to the current-voltage characteristic 152 of FIG. 2 during the second low-power stage 272. The plasma density in the second low-power stage 272 is greater than the plasma density in the first low-power stage 258, but is still only weakly-ionized. The pulsed power supply 102 is operating in the low-power mode.

In a second transient stage 278 of the voltage pulse 252, the pulsed power supply 102 operates in the high-power mode. In this second transient stage 278, the voltage 280 increases sharply compared with the first transient stage 264. The rise time of the voltage 280 is greater than about 0.5V/μsec. The voltage increase is about 60V to the peak voltage. The relatively fast rise time (on the order of about 5V/μsec) of the voltage 280 and the corresponding energy supplied by the pulsed power supply 102 shifts the electron energy distribution in the weakly-ionized plasma to higher energies. The higher energy electrons rapidly ionize the atoms in the plasma and create ionizational instability in the plasma that drives the weakly-ionized plasma to a non-steady state condition or a transient state. In a non-steady state, the Boltzman, Maxwell, and Saha distributions can be modified. The rapid increase in ionization of the atoms in the plasma results in a rapid increase in electron density and a formation of the strongly-ionized plasma that is characterized by a significant rise in the discharge current 282. The discharge current 282 rises to about 250 A at a non-linear rate for about 250 μsec.

One mechanism that contributes to a sharp increase in the electron energy distribution is known as diocotron instability. Diocotron instability is a wave phenomena that relates to the behavior of electron density gradients in the presence of electric and magnetic fields. Electron electrostatic waves can propagate along and across (parallel to and perpendicular to) field lines with different frequencies. These electron electrostatic waves can create electron drifts in the presence of a perpendicular electric field that are perpendicular to magnetic field lines.

Such electron drifts are inherently unstable, since any departure from charge neutrality in the form of charge bunching and separation (over distances on the order of the characteristic length scale in a plasma, the Debye length) create electric fields which cause second order ExB drifts that can exacerbate the perturbation. These instabilities are referred to as gradient-drift and neutral-drag instabilities. A charge perturbation associated with an electron Hall current developed by crossed magnetic and electric fields can produce radial electron drift waves. Drifts driven by the two density gradients (perpendicular and parallel) associated with a maximum in the radial electron density distribution can interact to cause the diocotron instability. Diocotron instability is described in "Magnetron Sputtering: Basic Physics and Application to Cylindrical Magnetrons" by John A. Thorton., J. Voc. Sci. Technol. 15(2), March/April p. 171-177, 1978.

A high-power stage 283 includes voltage oscillations 284 that have peak-to-peak amplitudes that are on the order of about 50V. These "saw tooth" voltage oscillations 284 may be caused by the electron density forming a soliton waveform or having another non-linear mechanism, such as diocotron instability discussed above, that increases the electron density as indicated by the increasing discharge current 286. The soliton waveform or other non-linear mechanism may also help to sustain the high-density plasma throughout the duration of the voltage pulse 252. Soliton waveforms, in particular, have relatively long lifetimes.

The discharge current 286 increases non-linearly through the high-power stage 283 until a condition corresponding to the voltage-current characteristic 154 of FIG. 2 is reached. This condition corresponds to the point in which the pulsed power supply 102 is supplying an adequate amount of continuous power to sustain the strongly-ionized plasma at a constant rate as illustrated by a substantially constant discharge current 287. The peak discharge current 288 in the high-power stage 283 is about 250 A at a voltage 290 of about -750V. The corresponding peak power 292 is about 190 kW.

The voltage pulse 252 is terminated at about 1.24 msec. The cathode assembly 116 remains negatively biased at about -300V after the termination of the voltage pulse 252. The plasma then rapidly decays as indicated by the rapidly decreasing discharge current 294.

The high-power stage 283 of the voltage pulse is sufficient to drive the plasma from a non-steady state in the second transient stage 278 to a strongly-ionized state corresponding to the voltage-current characteristic 154 of FIG. 2. The pulsed power supply 102 must supply a sufficient amount of uninterrupted power to continuously drive the initial plasma in the weakly-ionized state (in the second low-power stage 272) through the transient non-steady state (in the second transient stage 278) to the strongly-ionized state (in the high-power stage 283). The rise time of the voltage 280 in the second transient stage 278 is chosen to be sharp enough to shift the electron energy distribution of the initial plasma to higher energy levels to generate ionizational instabilities that creates many excited and ionized atoms. The rise time of the voltage 280 is greater than about 0.5V/μsec.

The magnitude of the voltage 280 in the second transient stage 278 is chosen to generate a strong enough electric field between the target 118 and the anode 124 (FIG. 1) to shift the electron energy distribution to high energies. The higher electron energies create excitation, ionization, and recombination processes that transition the state of the weakly-ionized plasma to the strongly-ionized state. The transient non-steady state plasma state exists for a time period during the second transient stage 278. The transient state results from plasma instabilities that occur because of mechanisms, such as increasing electron temperature caused by ExB Hall currents. Some of these plasma instabilities are discussed herein.

The strong electric field generated by the voltage 280 between the target 118 and the anode 124 (FIG. 1) causes several ionization processes. The strong electric field causes some direct ionization of ground state atoms in the weakly-ionized plasma. There are many ground state atoms in the weakly-ionized plasma because of its relatively low level of ionization. In addition, the strong electric field heats electrons initiating several other different type of ionization process, such as electron impact, Penning ionization, and associative ionization. Plasma radiation can also assist in the formation and maintenance of the high current discharge. The direct and other ionization processes of the ground state atoms in the weakly-ionized plasma significantly increase the rate at which a strongly-ionized plasma is formed.

In one embodiment, the ionization process is a multi-stage ionization process. The multi-stage voltage pulse 252 initially raises the energy of the ground state atoms in the weakly-ionized plasma to a level where the atoms are excited. For example, argon atoms require an energy of about 11.55 eV to become excited. The magnitude and rise time of the voltage 280 is then chosen to create a strong electric field that ionizes the exited atoms. Excited atoms ionize at a much higher rate than neutral atoms. For example, Argon excited atoms only require about 4 eV of energy to ionize while neutral atoms require about 15.76 eV of energy to ionize. The multi-step ionization process is described in co-pending U.S. patent application Ser. No. 10/249,844, entitled High-Density Plasma Source using Excited Atoms which is assigned to the present assignee. The entire disclosure of U.S. patent application Ser. No. 10/249,844 is incorporated herein by reference.

The multi-step ionization process can be described as follows:

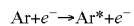

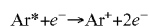

where Ar represents a neutral argon atom in the initial plasma, e⁻ represents an ionizing electron generated in response to an electric field, and Ar* represents an excited argon atom in the initial plasma. The collision between the excited argon atom and the ionizing electron results in the formation of an argon ion (Ar⁺) and two electrons.

In one embodiment, ions in the developing plasma strike the target 118 causing secondary electron emission. These secondary electrons interact with neutral or excited atoms in the developing plasma. The interaction of the secondary electrons with the neutral or excited atoms further increases the density of ions in the developing plasma as the feed gas 108 is replenished. Thus, the excited atoms tend to more rapidly ionize near the target surface 133 (FIG. 1) than the neutral argon atoms. As the density of the excited atoms in the plasma increases, the efficiency of the ionization process rapidly increases. The increased efficiency can result in an avalanche-like increase in the density of the plasma thereby creating a strongly-ionized plasma.

In one embodiment, the magnet assembly 130 generates a magnetic field 132 proximate to the target 118 that is sufficient to generate an electron ExB Hall current 135 (FIG. 1) which causes the electron density in the plasma to form a soliton or other non-linear waveform that increases at least one of the density and lifetime of the plasma as previously discussed. In some embodiments, the strength of the magnetic field 132 required to cause the electron density in the plasma to form such a soliton or non-linear waveform is in the range of fifty to ten thousand gauss.

An electron ExB Hall current 135 is generated when the voltage pulse 252 applied between the target 118 and the anode 124 generates primary electrons and secondary electrons that move in a substantially circular motion proximate to the target 118 according to crossed electric and magnetic fields. The magnitude of the electron ExB Hall current 135 is proportional to the magnitude of the discharge current in the plasma. In some embodiments, the electron ExB Hall current 135 is approximately in the range of three to ten times the magnitude of the discharge current.

The electron ExB Hall current 135 defines a substantially circular shape when the plasma density is relatively low. The substantially circular electron ExB Hall current 135 tends to form a more complex shape as the current density of the plasma increases. The shape is more complex because of the electron ExB Hall current 135 generates its own magnetic field that interacts with the magnetic field generated by the magnet assembly 130 and the electric field generated by the voltage pulse 252. In some embodiments, the electron ExB Hall current 135 becomes cycloidal shape as the current density of the plasma increases.

The electron density in the plasma can form a soliton or other non-linear waveforms when the small voltage oscillations 284 create a pulsing electric field that interacts with the electron ExB Hall current 135. The small voltage oscillations 284 tend to create oscillations in the plasma density that increase the density and lifetime of the plasma. The increase in plasma density shown in FIG. 4 in the time period between about 900 μsec and 1.2 msec can be the result of the electron density forming a soliton or other non-linear waveform. In this time period, the voltage is only slightly increasing with time, but the discharge current 286 increases at a much more rapid rate.

In one embodiment, the electron density increases in an avalanche-like manner because of electron overheating instability. Electron overheating instabilities can occur when heat is exchanged between the electrons in the plasma, the feed gas, and the walls of the chamber. For example, electron overheating instabilities can be caused when electrons in a weakly-ionized plasma are heated by an external field and then lose energy in elastic collisions with atoms in the feed gas. The elastic collisions with the atoms in the feed gas raise the temperature and lower the density of the feed gas. The decrease in the density of the gas results in an increase in the electron temperature because the frequency of elastic collisions in the feed gas decreases. The increase in the electron temperature again enhances the heating of the gas. The electron heating effect develops in an avalanche-like manner and can drive the weakly-ionized plasma into the transient non-steady state.

Figure 5B:
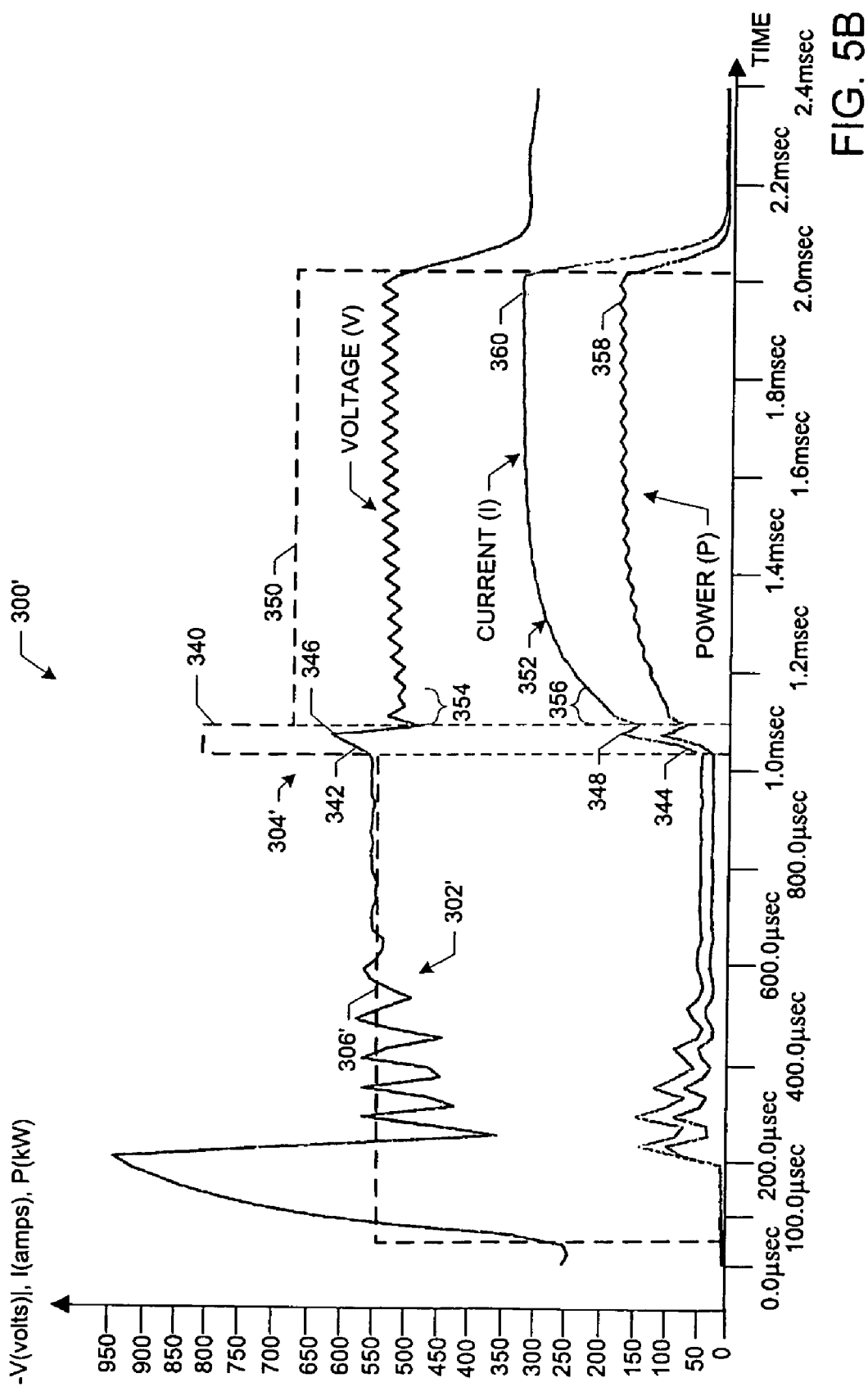

FIG. 5A-FIG. 5C are measured data 300, 300", and 300'" of other illustrative multi-stage voltage pulses 302, 302', and 302" generated by the pulsed power supply 102 of FIG. 1. The desired pulse shapes requested from the pulsed power supply 102 are superimposed in dotted lines 304, 304', and 304" onto each of the respective multi-stage voltage pulses 302, 302', and 302". The voltage pulses 302, 302', and 302" are generated for a magnetron sputtering source having a 10 cm diameter copper target and operating with argon feed gas at a chamber pressure of approximately $10^{-6}$ Torr. The repetition rate of the voltage pulses is 40 Hz.

The voltage pulse 302 illustrated in FIG. 5A is a two-stage voltage pulse 302 having a transient region included in both the low-power stage and the high-power stage of the pulse. A low-power stage 306 of the voltage pulse 302 including the first transient region is sufficient to ignite an initial plasma and eventually sustain a weakly-ionized plasma. The duration of the low-power stage 306 of the voltage pulse 302 is about 1.0 msec.

The relatively fast rise time (on the order of about 6.25V/μsec) of the voltage during the first transient region in the low-power stage 306 is sufficient to shift the electron energy distribution of the initial plasma to higher energies to generate ionizational instability that drives the initial plasma into a transient non-steady state condition. The rise time of the voltage should be greater than about 0.5V/μsec as previously discussed. However, since the pulsed power supply 102 is operating in a low-power mode during the low-power stage 306 of the voltage pulse 302, it does not supply a sufficient amount of uninterrupted power to continuously drive the initial plasma from the transient non-steady state to a strongly-ionized state corresponding to the current-voltage characteristic 154 of FIG. 2. Since there is insufficient energy stored in the pulsed power supply 102 in the low-power mode to create conditions that can sustain a strongly-ionized plasma, the plasma density oscillates and eventually the transient non-steady state of the plasma becomes weakly-ionized corresponding to the current-voltage characteristic 152 of FIG. 2.

The low-power stage 306 of the voltage pulse 302 includes relatively large voltage oscillations 308. The voltage oscillations 308 dampen when the initial plasma reaches the weakly-ionized condition corresponding to the current-voltage characteristic 152 of FIG. 2. The weakly-ionized plasma is characterized by the substantially constant discharge current 312. The voltage oscillations 308 occur because the pulsed power supply 102 does not supply enough energy in the low-power mode to drive the transient plasma into the strongly-ionized state that corresponds to the high-current regime illustrated by the current-voltage characteristic 154 of FIG. 2. Consequently, the discharge current 310 oscillates as the plasma rapidly expands and contracts. The rapidly expanding and contracting plasma causes the output voltage 308 to oscillate in response to the changing plasma load. The rapidly expanding and contracting plasma also prevents the electron density in the plasma from forming a soliton or other non-linear waveform that can increase the plasma density.

The average power 314 during the generation of the initial plasma is less than about 50 kW. The voltage 316 and the discharge current 318 are substantially constant after about 500 μsec, which corresponds to a plasma in a weakly-ionized condition.

A high-power stage 320 of the voltage pulse 302 includes a second transient region 321. The voltage increases by about 30V in the second transient region 321. The pulsed power supply 102 generates the high-power stage 320 of the voltage pulse 304 at about 1.1 msec. The voltage in the second transient region 321 has a magnitude and a rise time (on the order of about 5V/µsec) that is sufficient to drive the weakly-ionized plasma into a transient non-steady state. The rise time of the voltage is greater than about 0.5V/µsec. In the high-power stage 320, the pulsed power supply 102 is operating in the high-power mode and supplies a sufficient amount of uninterrupted power to drive the weakly-ionized plasma from the transient non-steady state to a strongly-ionized state corresponding to the current-voltage characteristic 154 of FIG. 2.

Voltage oscillations 322 occur for about 300 µsec. The voltage oscillations 322 create current oscillations 324 in the transient plasma. The voltage oscillations 322 are caused, at least in part, by the changing resistive load in the plasma. The pulsed power supply 102 attempts to maintain a constant voltage and a constant discharge current, but the transient plasma exhibits a rapidly changing resistive load.

The voltage oscillations 322 can also be caused by ionizational instabilities in the plasma as previously discussed. Ionizational instabilities can occur when the degree of ionization in the plasma changes because of varying magnitudes of the crossed electric and magnetic fields. The degree of ionization can grow exponentially as the ionizational instability develops. The exponential growth in ionization may be a consequence of electron gas overheating as a result of developing electron Hall currents. The exponential growth in ionization dramatically increases the discharge current.

The voltage oscillations 322 are minimized after about 1.5 msec. The minimum voltage oscillations 323 can create a pulsing electric field that interacts with the electron ExB Hall current 135 (FIG. 1) to generate oscillations in the plasma density that increase the density and lifetime of the plasma. The plasma is in the high-current regime corresponding to the current-voltage characteristic 154 of FIG. 2 in which the pulsed power supply 102 supplies an adequate amount of energy to increase the density of the plasma non-linearly to the strongly-ionized state. The average voltage 326 is substantially constant while the current 328 increases nonlinearly with insignificant oscillations.

After the voltage oscillations 322, the average voltage 326 remains lower than the voltage 316 present during the low-power stage 306 of the voltage pulse 304. The discharge current 324 rises to a peak current 330. After about 2.0 msec the average voltage 326 is about −500V, the discharge current 330 is almost 300 A and the power 332 is about 150 kW. These conditions correspond to a strongly-ionized plasma in the high-current regime.

The pulsed power supply 102 supplies power to the transient plasma during the high-power stage 320 at a relatively slow rate. This relatively slow rate corresponds to a relatively slow rate of increase in the discharge current 328 over a time period of about 1.0 msec. In one embodiment of the invention, the pulsed power supply 102 supplies high-power to the plasma relatively quickly thereby increasing the density of the plasma more rapidly. The density of the plasma can also be increased by increasing the pressure inside the plasma chamber.

FIG. 5A illustrates that in order to sustain a strongly-ionized plasma in the high-current regime corresponding to the current-voltage characteristic 154 of FIG. 2 at least two conditions must be satisfied. The first condition is that the rise time of a voltage in a transient region must be sufficient to shift the electron energy distribution of the initial plasma to higher energies to generate ionizational instability that drives the plasma into a transient non-steady state condition. The second condition is that the pulsed power supply must supply a sufficient amount of uninterrupted power to drive the plasma from the transient non-steady state to a strongly-ionized state corresponding to the current-voltage characteristic 154 of FIG. 2.

In the low-power stage 306, the voltage in the first transient region has a sufficient rise time to shift the electron energy distribution of the initial plasma to higher energies as shown by current oscillations 310. However, the pulsed power supply 102 is in the low-power mode and does not supply a sufficient amount of uninterrupted power to drive the initial plasma from the transient non-steady state to a strongly-ionized state. In the high-power stage 320, the voltage in the second transient region 321 has a sufficient rise time to shift the electron energy distribution of the initial plasma to higher energies as shown by current oscillations 324. Also, the pulsed power supply 102 (in the high-power mode) supplies a sufficient amount of uninterrupted power to drive the weakly-ionized plasma from the transient non-steady state to a strongly-ionized state.

FIG. 5B is measured data 300' of another illustrative multi-stage voltage pulse 302' generated by the pulsed power supply 102 of FIG. 1. The voltage pulse 302' is a three-stage voltage pulse 302'. The low-power stage 306' of the voltage pulse 302' including a first transient region has a rise time and magnitude that ignites an initial plasma. The low-power stage 306' corresponds to a low-power mode of the pulsed power supply 102 and is similar to the low-power stage 306 of the voltage pulse 302 that was described in connection with FIG. 5A.

A transient stage 340 of the three-stage voltage pulse 302' is a transition stage where the pulsed power supply 102 transitions from the low-power mode to the high-power mode. The duration of the transient stage 340 is about 40 µsec, but can have a duration that is in the range of about 10 µsec to 5,000 µsec. The discharge voltage 342 and discharge current 344 both increase sharply in the transient stage 340 as previously discussed.

The transient stage 340 of the voltage pulse 302' has a rise time that shifts the electron energy distribution in the weakly-ionized plasma to higher energies thereby causing a rapid increase in the ionization rate by driving the weakly-ionized plasma into a transient non-steady state. Plasmas can be driven into transient non-steady states by creating plasma instabilities from the application of a strong electric field.

A high-power stage 350 of the three-stage voltage pulse 302' is similar to the high-power stage 320 of the two-stage voltage pulse 302 that was described in connection with FIG. 5A. However, the discharge current 352 increases at a much faster rate than the discharge current 328 that was described in connection with FIG. 5A. The discharge current 328 increases more rapidly because the transient stage 340 of the voltage pulse 302' supplies high power to the weakly-ionized initial plasma at a rate and duration that is sufficient to more rapidly create a strongly-ionized plasma having a discharge current 352 that increases non-linearly.

Voltage oscillations 354 in the high-power stage 350 are sustained for about 100 µsec. The voltage oscillations can are caused by the ionizational instabilities in the plasma as described herein, such as diocotron oscillations. The voltage oscillations 354 cause current oscillations 356. The maximum power 358 in the third stage 350 is approaching 200 kW, which corresponds to a maximum discharge current 360 that is almost 350 A. The third stage 350 of the voltage pulse 302' is terminated after about 1.0 msec.

FIG. 5C is measured data 300" of another illustrative multi-stage voltage pulse 302" generated by the pulsed power supply 102 of FIG. 1. The voltage pulse 302" is a three-stage voltage pulse 302". The low-power stage 306" of the voltage pulse 302" including a first transient region has a rise time and magnitude that ignites an initial plasma. The low-power stage 306" corresponds to a low-power mode of the pulsed power supply 102 and is similar to the low-power stage 306 of the voltage pulse 302 that was described in connection with FIG. 5A and the low-power stage 306' of the voltage pulse 302' that was described in connection with FIG. 5B.

A transient stage 370 of the three-stage voltage pulse 302" is a transition stage where the pulsed power supply 102 transitions from the low-power mode to the high-power mode. The duration of the transient stage 370 is about 60 μsec, which is about 1.5 times longer than the duration of the transient stage 340 of the voltage pulse 302' that was described in connection with FIG. 5B. The peak-to-peak magnitude of the voltage 376 (~100V) is greater than the peak-to-peak magnitude of the voltage 346 (~70V) of FIG. 5B. The discharge voltage 372 and discharge current 374 both increase sharply in the transient stage 370 because of the high value of the peak-to-peak magnitude of the voltage 376.

The magnitude and rise time of the transient stage 370 is sufficient to drive the initial plasma into a non-steady state condition. The discharge voltage 372 and the discharge current 374 increase sharply. The peak discharge voltage 376 is about −650V, which corresponds to a discharge current 377 that is greater than about 200 A. The discharge voltage 378 then decreases as the discharge current 374 continues to increase.

The discharge current 374 in the transient stage 370 increases at a much faster rate than the discharge current 352 that was described in connection with FIG. 5B because the peak-to-peak magnitude of the voltage 376 is higher and the duration of the transient stage 370 is longer than in the transient stage 340 of FIG. 5B. The duration of the transient stage 370 is long enough to supply enough uninterrupted energy to the weakly-ionized plasma to rapidly increase the rate of ionization of the transient plasma.

A high-power stage 380 of the three-stage voltage pulse 302" is similar to the high-power stage 350 of the three-stage voltage pulse 302' that was described in connection with FIG. 5B. However, the voltage pulse 302" does not include the large voltage oscillations that were described in connection with FIGS. 5A and 5B. The large voltage oscillations are not present in the voltage pulse 302" because the transient plasma is already substantially strongly-ionized as a result of the energy supplied in the transient stage 370. Consequently, the initial plasma transitions in a relatively short period of time from a weakly-ionized condition to a strongly-ionized condition.

Small voltage oscillations 384 in the voltage pulse 302" may be caused by the electron density forming a soliton waveform or having another non-linear mechanism that increases the electron density as indicated by the increasing discharge current 286. The soliton waveform or other non-linear mechanism may also help to sustain the high-density plasma throughout the duration of the voltage pulse 302'.

The discharge current 382 in the third stage 380 is greater than about 300 A. Them maximum power 386 in the third stage 380 approaches 200 kW. The third stage 380 of the voltage pulse 304" is terminated after about 1.0 msec.

Figure 6A:
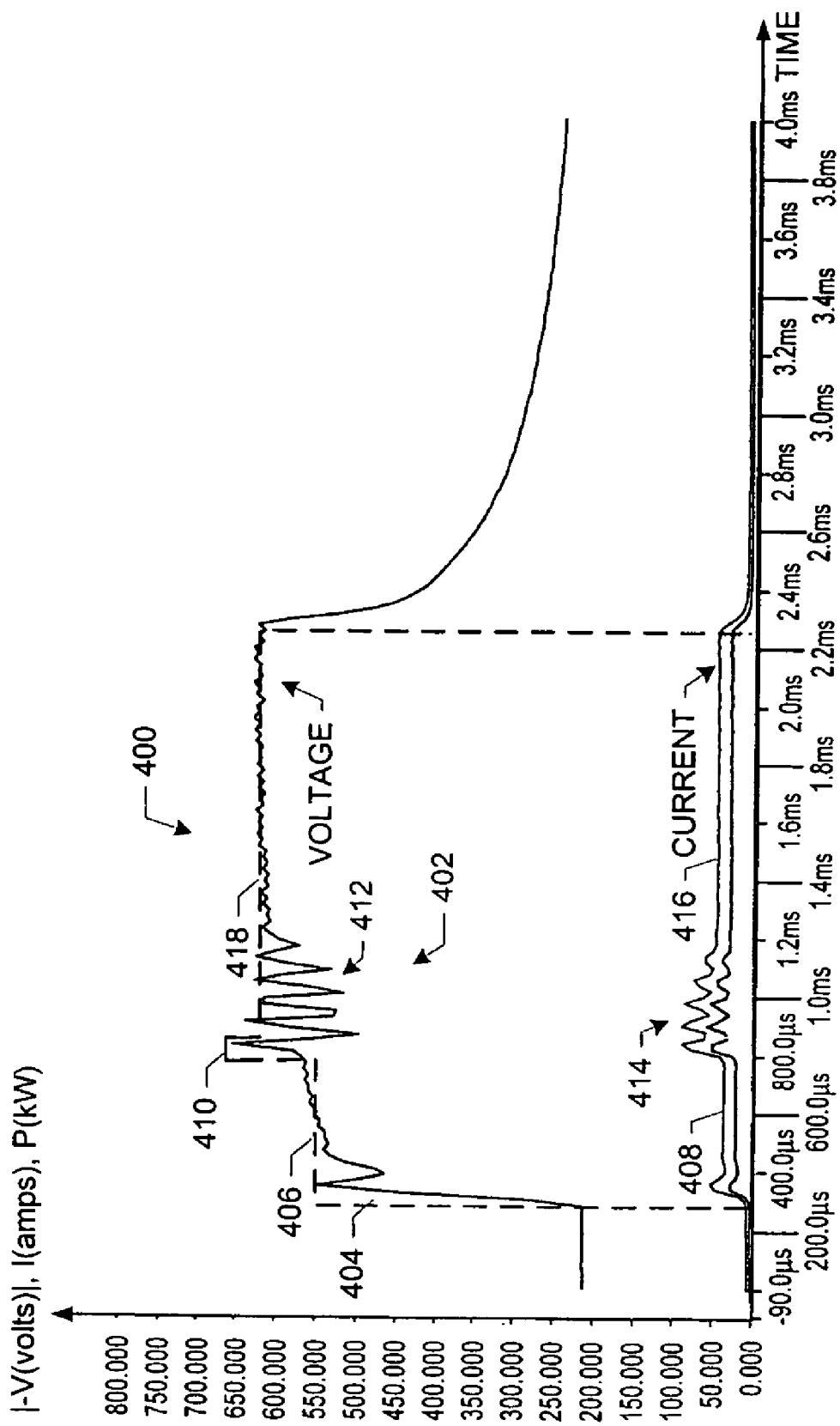
FIG. 6A and FIG. 6B are measured data of multi-stage voltage pulses generated by the pulsed power supply of FIG. 1 that illustrate the effect of pulse duration in the transient stage of the pulse on the plasma discharge current.
Figure 6B:
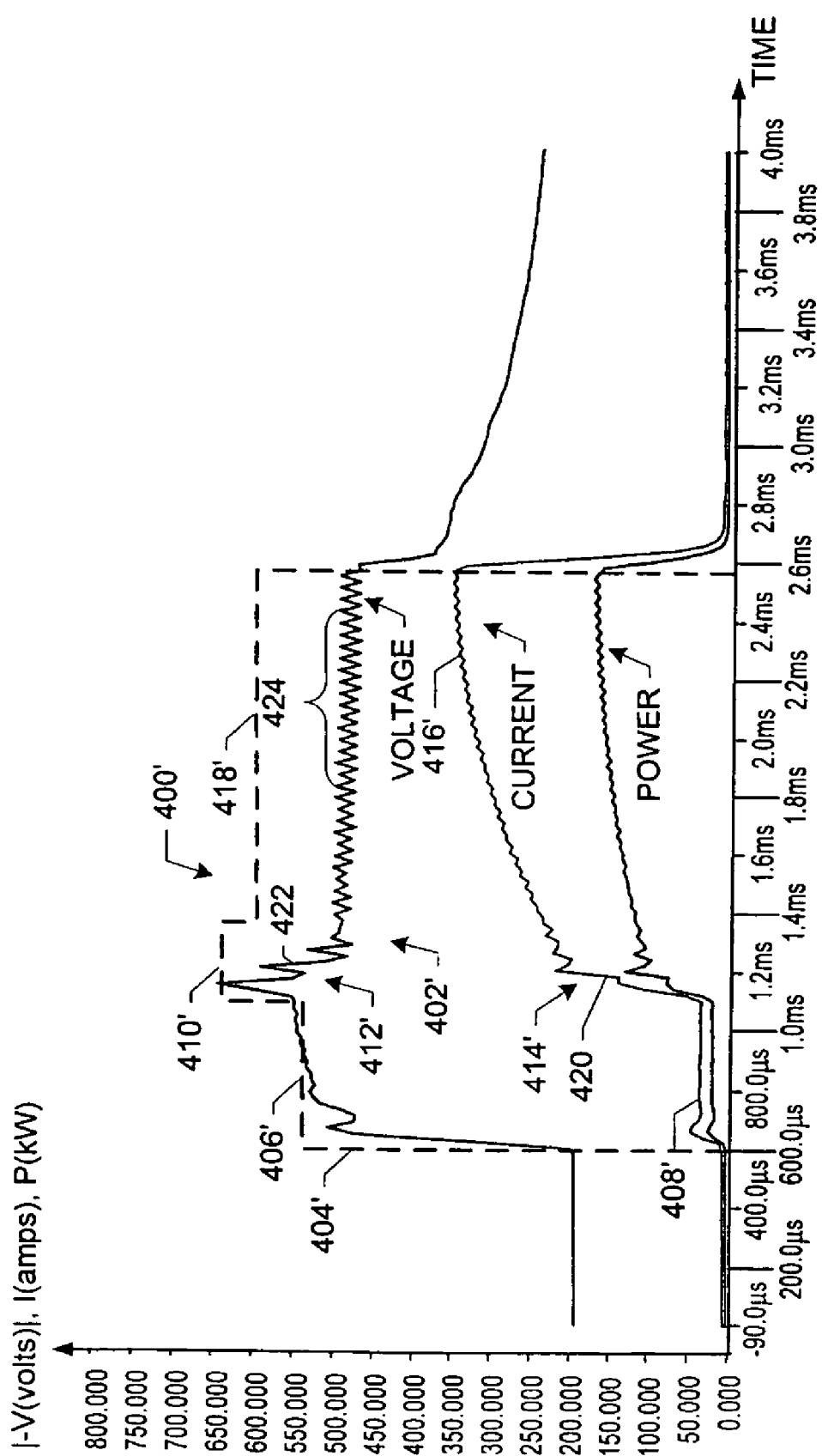

FIG. 6A and FIG. 6B are measured data of multi-stage voltage pulses 400, 400' generated by the pulsed power supply 102 of FIG. 1 that illustrate the effect of pulse duration in the transient stage of the pulse on the plasma discharge current. The multi-stage voltage pulses 400, 400' were applied to a standard magnetron with a 15 cm diameter copper target. The feed gas was argon and the chamber pressure was about 3 m Torr.

The multi-stage voltage pulse 400 shown in FIG. 6A is a three-stage voltage pulse 402 as indicated by the dotted line 404. A low-power stage 406 of the voltage pulse 402 has a magnitude and a rise time that is sufficient to ignite a feed gas and generate an initial plasma. The pulsed power supply 102 is operating in the low-power mode during the low-power stage 406. The maximum voltage in the low-power stage 406 is about −550V. The initial plasma develops into a weakly-ionized plasma having a relatively low-level of ionization corresponding to the current-voltage characteristic 152 of FIG. 2. The weakly-ionized plasma can be in a steady state corresponding to a substantially constant discharge current 408 that is less than about 50 A.

The pulsed power supply 102 is in the high-power mode during a transient stage 410. In the transient stage 410, the voltage increases by about 100V. The rise time of the voltage increase is sufficient to create a strong electric field through the weakly-ionized plasma that promotes excitation, ionization, and recombination processes. The excitation, ionization, and recombination processes create plasma instabilities, such as ionizational instabilities, that result in voltage oscillations 412. The duration of the transient stage 410 of the voltage pulse 402 is, however, insufficient to shift the electron energy distribution in the plasma to higher energies because the energy supplied by the pulsed power supply 102 in the transient stage 410 is terminated abruptly as illustrated by the dampening discharge current 414. Consequently, the transient plasma exhibits ionizational relaxation and eventually decays to a weakly-ionized plasma state corresponding to a substantially constant discharge current 416.

A high-power stage 418 of the voltage pulse 402 has a lower magnitude than the transient stage 410 of the voltage pulse, but a higher magnitude than the low-power stage 406. The high-power stage 418 is sufficient to maintain the weakly-ionized plasma, but cannot drive the plasma from the weakly-ionized condition to the strongly-ionized condition corresponding to the current-voltage characteristic 154 of FIG. 2. This is because the transient stage 410 did not provide the conditions necessary to sufficiently shift the electron energy distribution in the weakly-ionized plasma to high enough energies to create ionizational instabilities in the plasma. The voltage pulse 402 is terminated after about 2.25 msec.

The multi-stage voltage pulse 400' illustrated in FIG. 6B is a three-stage voltage pulse 402' as indicated by the dotted line 404'. A low-power stage 406' of the voltage pulse 402' is similar to the low-power stage 406 of the voltage pulse 402 that was described in connection with FIG. 6A. The low-power stage 406' has a magnitude and a rise time that is sufficient to ignite a feed gas and generate an initial plasma. The pulsed power supply 102 is operating in the low-power mode during the low-power stage 406'. The maximum voltage in the low-power stage is also about −550V. The initial plasma develops into a weakly-ionized plasma having a relatively low-level of ionization corresponding to the current-voltage characteristic 152 of FIG. 2. The weakly-ionized plasma can be in a steady state corresponding to a substantially constant discharge current 408' that is less than about 50 A.

The transient stage 410' of the voltage pulse 402' creates a strong electric field through the weakly-ionized plasma that promotes excitation, ionization, and recombination processes. The excitation, ionization, and recombination processes create plasma instabilities, such as ionizational instabilities, that result in voltage oscillations 412'. The rise time of the peaks in the oscillating voltage 412' create instabilities in the weakly-ionized plasma that rapidly increase the ionization rate of the weakly-ionized plasma as illustrated by the rapidly increasing discharge current 414'.

The duration of the transient stage 410' of the voltage pulse 402' is sufficient to shift the electron energy distribution in the plasma to higher energies that rapidly increase the ionization rate. The duration of the transient stage 410' of FIG. 6B is five times more than the duration of the transient stage 410 of FIG. 6A. The discharge current 420 increases nonlinearly as the average discharge voltage 422 decreases. The magnitude of the discharge current can be controlled by varying the magnitude and the duration of the transient stage 410' of the voltage pulse 402'.

The high-power stage 418' of the voltage pulse 402' has a lower magnitude than the transient stage 410'. The pulsed power supply 102 provides a sufficient amount of energy during the high-power stage 418' to maintain the plasma in a strongly-ionized condition corresponding to the current-voltage characteristic 154 of FIG. 2. The maximum discharge current 416' for the plasma in the strongly-ionized state is about 350 A. The voltage pulse 402' is terminated after about 2.25 msec.

Figure 7A:
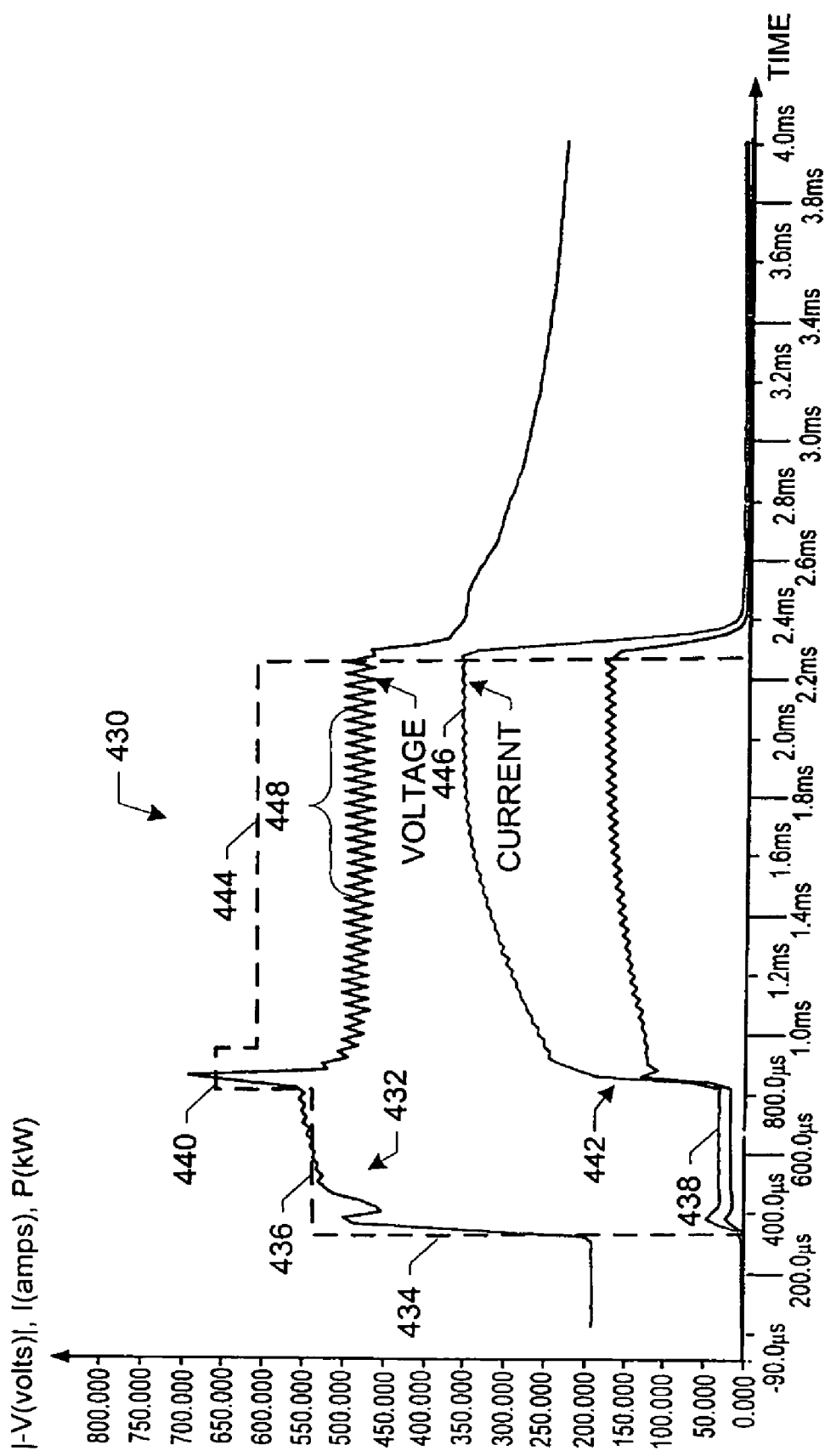
FIG. 7A and FIG. 7B are measured data of multi-stage voltage pulses generated by the pulsed power supply of FIG. 1 that show the effect of the pulsed power supply operating mode on the plasma discharge current.
Figure 7B:
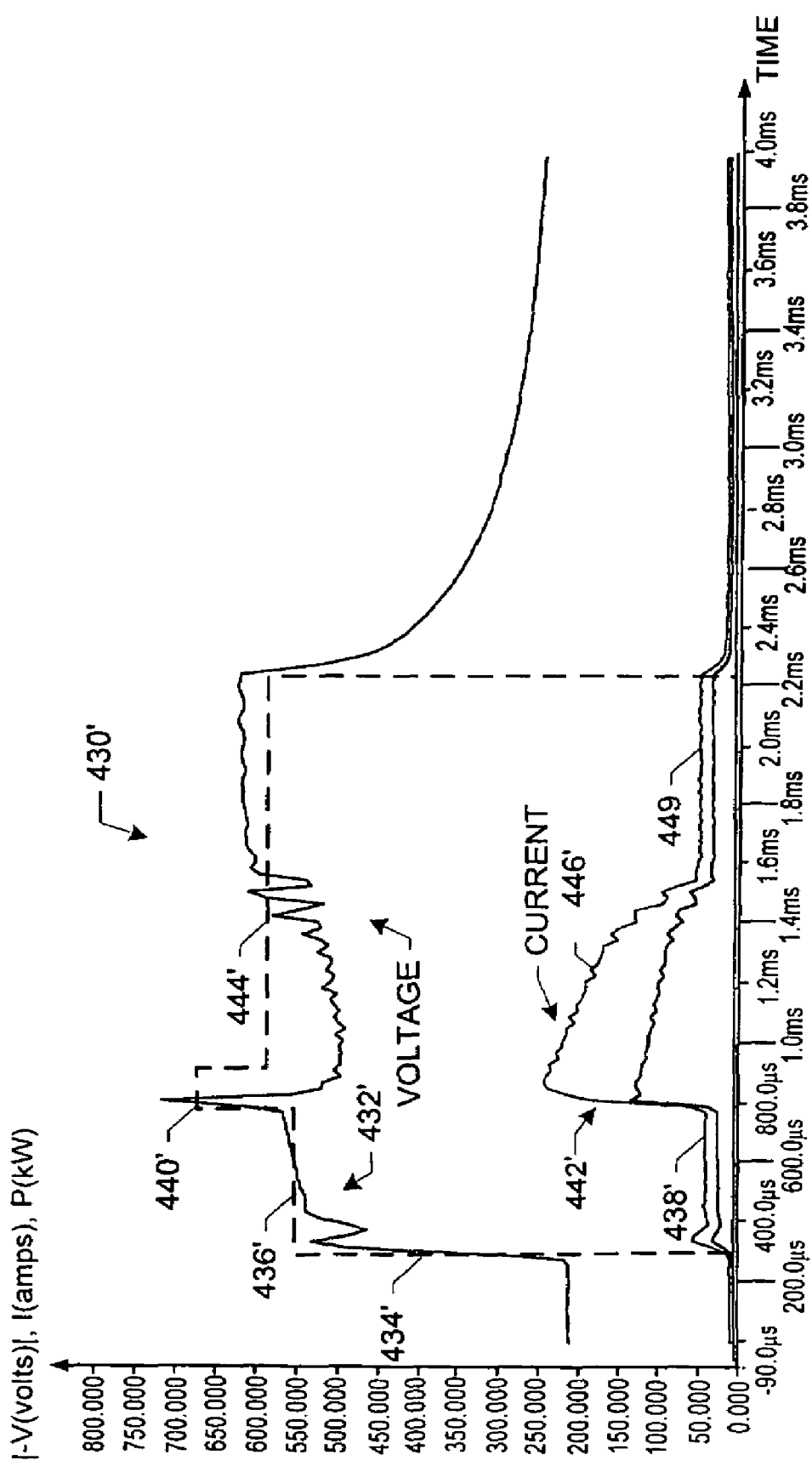

FIG. 7A and FIG. 7B are measured data of multi-stage voltage pulses 430, 430' generated by the pulsed power supply 102 of FIG. 1 that show the effect of the pulsed power supply operating mode on the plasma discharge current. The multi-stage voltage pulses 430, 430' were applied to a standard magnetron with a 15 cm diameter copper target. The feed gas was argon and the chamber pressure was about 3 mTorr.

The multi-stage voltage pulse 430 shown in FIG. 7A is a three-stage voltage pulse 432 as indicated by the dotted line 434. The pulsed power supply 102 generates a low-power stage 436 of the voltage pulse 432 that has a magnitude and a rise time that is sufficient to ignite a feed gas to generate an initial plasma. The maximum voltage in the ignition stage is about −550V. The pulsed power supply 102 is operating in the low-power mode. The initial plasma develops into a weakly-ionized plasma having a relatively low-level of ionization corresponding to the current-voltage characteristic 152 of FIG. 2. The weakly-ionized plasma can be in a steady state corresponding to a substantially constant discharge current 408' that is less than about 50 A.

The pulsed power supply 102 generates a transient stage 440 of the voltage pulse 432 that increases the voltage by about 150V. The rise time, amplitude and duration of the voltage in the transient stage 440 of the voltage pulse 432 is sufficient to promote enough excitation, ionization, and recombination processes for the weakly-ionized plasma to experience a high rate of ionization as illustrated by the rapidly increasing discharge current 442. The pulsed power supply 102 is operating in a high-power mode during the transient stage 440.

The high-power stage 444 of the voltage pulse 432 has a lower magnitude than the transient stage 440 but has a sufficient magnitude to maintain the strongly-ionized plasma in the high-current regime corresponding to the current-voltage characteristic 154 of FIG. 2. The discharge current 446 for the strongly-ionized plasma is about 350 A. The pulsed power supply 102 operates in the high-power mode during the high-power stage 444 and generates enough uninterrupted energy to sustain the strongly-ionized plasma. The voltage pulse 432 is terminated after about 2.25 msec.

The multi-stage voltage pulse 430' of FIG. 7B is a three-stage voltage pulse 432' as indicated by the dotted line 434'. The pulsed power supply generates a low-power stage 436' of the voltage pulse 432' that is similar to the low-power stage 436 of the voltage pulse 432 of FIG. 7A. The low-power stage 436' of the voltage pulse 432' has a magnitude and a rise time that is sufficient to ignite a feed gas to generate an initial plasma. The pulsed power supply 102 is operating in the low-power mode. The maximum voltage in the ignition stage is about −550V. The initial plasma develops into a weakly-ionized plasma having a relatively low-level of ionization. The weakly-ionized plasma can be in a steady state that corresponds to a substantially constant discharge current 438' that is less than about 50 A.

The pulsed power supply 102 generates a transient stage 440' of the voltage pulse 432' that increases the voltage by about 150V. The transient stage 440' is similar to the transient stage 440 of FIG. 7A. The amplitude and duration of the transient stage 440' of the voltage pulse 432' is sufficient to promote enough excitation, ionization, and recombination processes to rapidly increase the ionization rate of the weakly-ionized plasma as illustrated by the rapidly increasing discharge current 442'. The pulsed power supply 102 is operating in a high-power mode during the transient stage 440'.

The pulsed power supply 102 generates a high-power stage 444' that includes a voltage having a lower magnitude than the voltage in the second stage 440'. The voltage in the high-power stage 444' decreases to below −500V which is insufficient to sustain a strongly-ionized plasma. Thus, the strongly-ionized plasma exhibits ionizational relaxation and eventually decays to a weakly-ionized plasma state corresponding to a quasi-stationary discharge current 449. The voltage pulse 432' is terminated after about 2.25 msec.

Figure 8:
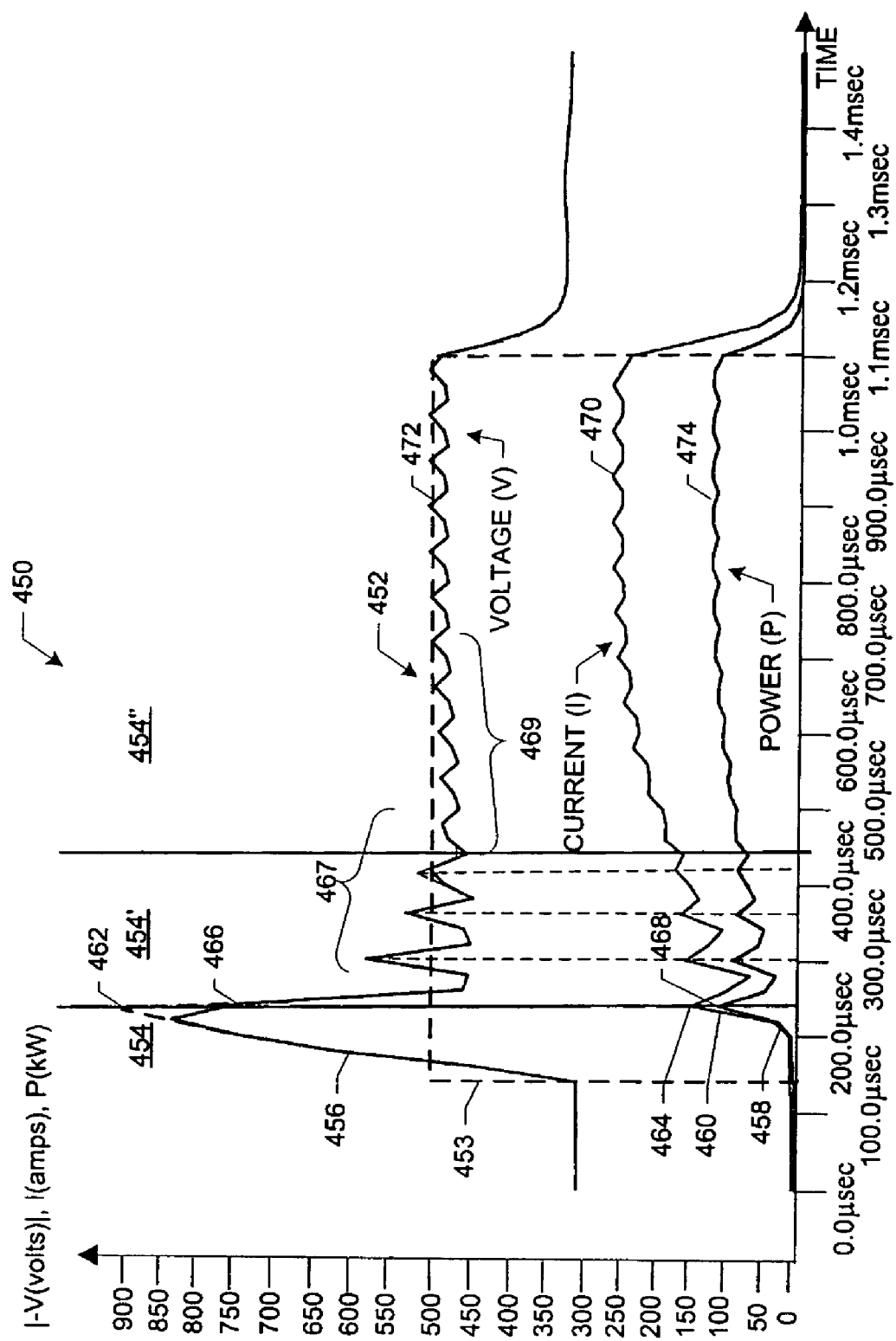
FIG. 8 is measured data for an exemplary single-stage voltage pulse generated by the pulsed power supply of FIG. 1 that produces a high-density plasma according to the invention that is useful for high-deposition rate sputtering.

FIG. 8 is measured data 450 for an exemplary single-stage voltage pulse 452 generated by the pulsed power supply 102 of FIG. 1 that produces a high-density plasma according to the invention that is useful for high-deposition rate sputtering. The voltage pulse 452 is a single-stage voltage pulse as indicated by the dotted line 453. The pulsed power supply 102 operates in a high-power mode throughout the duration of the voltage pulse 452.

The voltage pulse 452 includes an ignition region 454 that has a magnitude and a rise time that is sufficient to ignite a feed gas to generate an initial plasma. The discharge current 458 increases after the initial plasma is ignited. The initial plasma is ignited in about 100 μsec.

After ignition, the discharge current 460 and the voltage 456 both increase. The initial peak voltage 462 is about −900V. The voltage then begins to decrease. The discharge current 460 reaches an initial peak current 464 corresponding to a voltage 466. The initial peak discharge current 464 is about 150 A at a discharge voltage 466 of about The peak discharge current 464 and corresponding discharge voltage 466 corresponds to a power 468 that is about 120 kW. The time period from the ignition of the plasma to the initial peak discharge current 464 is about 50 μsec. The initial plasma does not reach a steady state condition but instead remains in a transient state.

The voltage pulse 452 also includes a transient region 454' having voltage oscillations 467 that include rise times which are sufficient to shift the electron energy distribution in the initial plasma to higher energies that create ionizational instabilities that cause a rapid increase in the ionization rate as described herein. The initial plasma remains in a transient state.

The voltage pulse 452 also includes a high-power region 454". The voltage in the high-power region 454" has a magnitude that is sufficient to sustain a strongly-ionized plasma. Small voltage oscillations 469 in the voltage pulse 452 may be caused by the electron density forming a soliton waveform or having another non-linear mechanism that increases the electron density as indicated by the increasing discharge current 470. The soliton waveform or other non-linear mechanism may also help to sustain the strongly-ionized plasma throughout the duration of the voltage pulse 452.

The single-stage voltage pulse 452 includes a voltage 456 that is sufficient to ignite an initial plasma, voltage oscillations 467 that are sufficient to create ionizational instabilities in the initial plasma, and a voltage 472 that is sufficient to sustain the strongly-ionized plasma. The pulsed power supply 102 operates in the high-power mode throughout the duration of the single-stage voltage pulse 452. The peak discharge current 470 in the high-density plasma is greater than about 250 A for a discharge voltage 472 of about −500V. The power 474 is about 125 kW. The pulse width of the voltage pulse 452 is about 1.0 msec.

Figure 9:
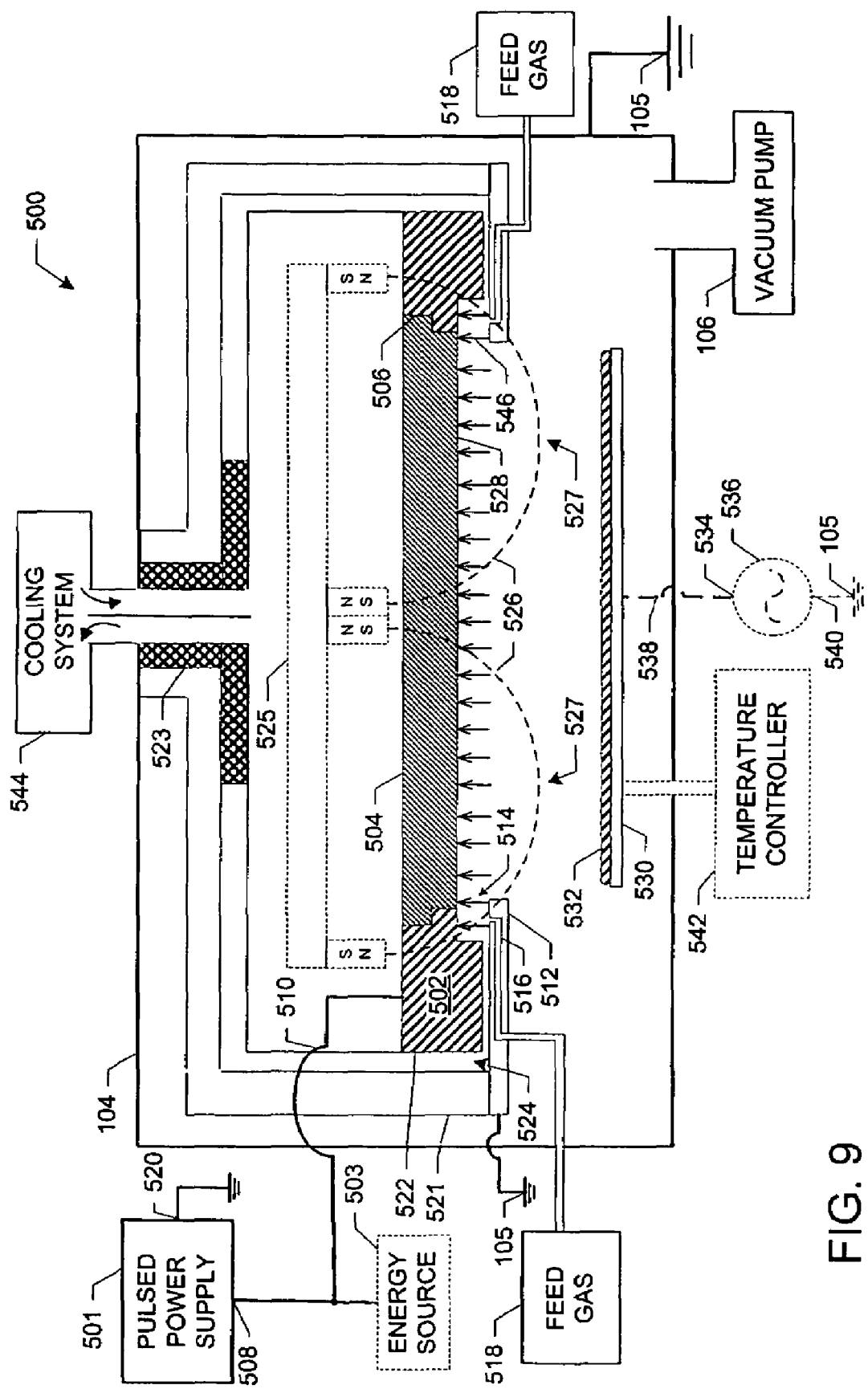
FIG. 9 illustrates a cross-sectional view of a plasma sputtering apparatus having a pulsed direct current (DC) power supply according to another embodiment of the invention.

FIG. 9 illustrates a cross-sectional view of a plasma sputtering apparatus 500 having a pulsed direct current (DC) power supply 501 according to another embodiment of the invention. The plasma sputtering apparatus 500 includes a vacuum chamber 104 for containing a plasma. The vacuum chamber 104 can be coupled to ground 105. The vacuum chamber 104 is positioned in fluid communication with a vacuum pump 106 that is used to evacuate the vacuum chamber 104 to high vacuum. The pressure inside the vacuum chamber 104 is generally less than $10^{-1}$ Torr for most plasma operating conditions.

The plasma sputtering apparatus 500 also includes a cathode assembly 502. The cathode assembly 502 is generally in the shape of a circular ring. The cathode assembly 502 includes a target 504. The target 504 is generally in the shape of a disk and is secured to the cathode assembly 502 through a locking mechanism, such as a clamp 506. The cathode assembly 502 is electrically connected to a first terminal 508 of the pulsed power supply 501 with an electrical transmission line 510.

In some embodiments, the plasma sputtering apparatus 500 includes an energy storage device 503 that provides a source of energy that can be controllably released into the plasma. The energy storage device 503 is electrically coupled to the cathode assembly 502. In one embodiment, the energy storage device 503 includes a capacitor bank.

A ring-shaped anode 512 is positioned in the vacuum chamber 104 proximate to the cathode assembly 502 so as to form a gap 514 between the anode 512 and the cathode assembly 502. The gap 514 can be between about 1.0 cm and 12.0 cm wide. The gap 514 can reduce the probability that an electrical breakdown condition (i.e., arcing) will develop in the chamber 104. The gap 514 can also promote increased homogeneity of the plasma by controlling a gas flow through the gap. The anode 512 can include a plurality of feed gas injectors 516 that inject feed gas into the gap 514. In the embodiment shown, the feed gas injectors 516 are positioned within the anode 512. The feed gas injectors 516 are coupled to one or more feed gas sources 518. The feed gas sources can include atomic feed gases, reactive gases, or a mixture of atomic and reactive gases. Additionally, excited atom sources (not shown) or metastable atom sources (not shown) can be coupled to the feed gas injectors 516 to supply excited atoms or metastable atoms to the chamber 104.

The anode 512 is electrically connected to ground 105. A second terminal 520 of the pulsed power supply 501 is also electrically connected to ground 105. In other embodiments, the anode 512 is electrically connected to the second terminal 520 of the pulsed power supply 501.

The anode 512 can be integrated with or connected to a housing 521 that surrounds the cathode assembly 502. An outer edge 522 of the cathode 502 is isolated from the housing 521 with insulators 523. The space 524 between the outer edge 522 of the cathode assembly 502 and the housing 521 can be filled with a dielectric.

The plasma sputtering apparatus 500 can include a magnet assembly 525 that generates a magnetic field 526 proximate to the target 504. The magnetic field 526 is less parallel to the surface of the cathode assembly 502 at the poles of the magnets in the magnet assembly 525 and more parallel to the surface of the cathode assembly 502 in the region 527 between the poles of the magnets in the magnetic assembly 525.

The magnetic field 526 is shaped to trap and concentrate secondary electrons emitted from the target 504 that are proximate to the target surface 528. The magnetic field 526 increases the density of electrons and therefore, increases the plasma density in the region 527. The magnetic field 526 can also induce an electron Hall current that is generated by the crossed electric and magnetic fields. The strength of the electron Hall current depends, at least in part, on the density of the plasma and the strength of the crossed electric and magnetic fields. Crossed electric and magnetic fields generated in the gap 514 can enhance the ionizational instability effect on the plasma as discussed herein.

The plasma sputtering apparatus 500 also includes a substrate support 530 that holds a substrate 532 or other work piece. The substrate support 530 can be electrically connected to a first terminal 534 of a RF power supply 536 with an electrical transmission line 538. A second terminal 540 of the RF power supply 536 is coupled to ground 105. The RF power supply 536 can be connected to the substrate support 530 through a matching unit (not shown). In one embodiment a temperature controller 542 is thermally coupled to the substrate support 530. The temperature controller 542 regulates the temperature of the substrate 532.

The plasma sputtering apparatus 500 can also include a cooling system 544 to cool the target 504 and the cathode assembly 502. The cooling system 544 can be any one of numerous types of liquid or gas cooling system that are known in the art.

In operation, the vacuum pump 106 evacuates the chamber 104 to the desired operating pressure. The feed gas is injected into the chamber 104 from the feed gas source 518 through the gas inlet 516. The pulsed power supply 501 applies negative voltage pulses to the cathode 502 (or positive voltage pulses to the anode 512) that generate an electric field 546 in the gap 514 between the cathode assembly 502 and the anode 512. The magnitude and rise time of the voltage pulse are chosen such that the resulting electric field 546 ionizes the feed gas in the gap 514, thereby igniting an initial plasma in the gap 514.

The geometry of the gap 514 can be chosen to minimize the probability of arcing and to facilitate the generation of a very strong electric field 546 with electric field lines that are perpendicular to the surface 528 of the target 504 and the cathode 502. This strong electric field 546 can enhance the ionizational instability in the plasma by increasing the volume of excited atoms including metastable atoms that are generated from ground state atoms in the initial plasma. The increased volume of exited atoms can increase the density of the plasma in a non-linear manner as previously discussed.

The plasma is maintained, in part, by secondary electron emission from the target 504. In embodiments including the magnet assembly 525, the magnetic field 526 confines the secondary electrons proximate to the region 527 and, therefore, concentrates the plasma proximate to the target surface 528. The magnetic field 526 also induces an electron Hall current proximate to the target surface 528, which further confines the plasma and can cause the electron density to form a soliton waveform or other non-linear waveform.

Ions in the plasma bombard the target surface 528 since the target 504 is negatively biased. The impact caused by the ions bombarding the target 504 dislodges or sputters material from the target 504. The sputtering rate generally increases as the density of the plasma increases.

The RF power supply 536 generates a negative RF bias voltage on the substrate 532 that attracts positively ionized sputtered material to the substrate 532. The sputtered material forms a thin film of target material on the substrate 532. The magnitude of the RF bias voltage on the substrate 532 can be chosen to optimize parameters, such as sputtering rate and adhesion of the sputtered firm to the substrate 532, and to minimize damage to the substrate 532. The temperature controller 542 can regulate the temperature of the substrate 532 to avoid overheating the substrate 532.

Although FIG. 9 illustrates a magnetron sputtering system, skilled artisans will appreciate that many other plasma systems can utilize methods for generating high-density plasmas using ionizational instability according to the invention. For example, the methods for generating high-density plasmas using ionizational instability according to the invention can be used to construct a plasma thruster. The method of generating a high-density plasma for a thruster is substantially the same as the method described in connection with FIG. 9 except that the plasma is accelerated through an exhaust by external fields.

Figure 10:
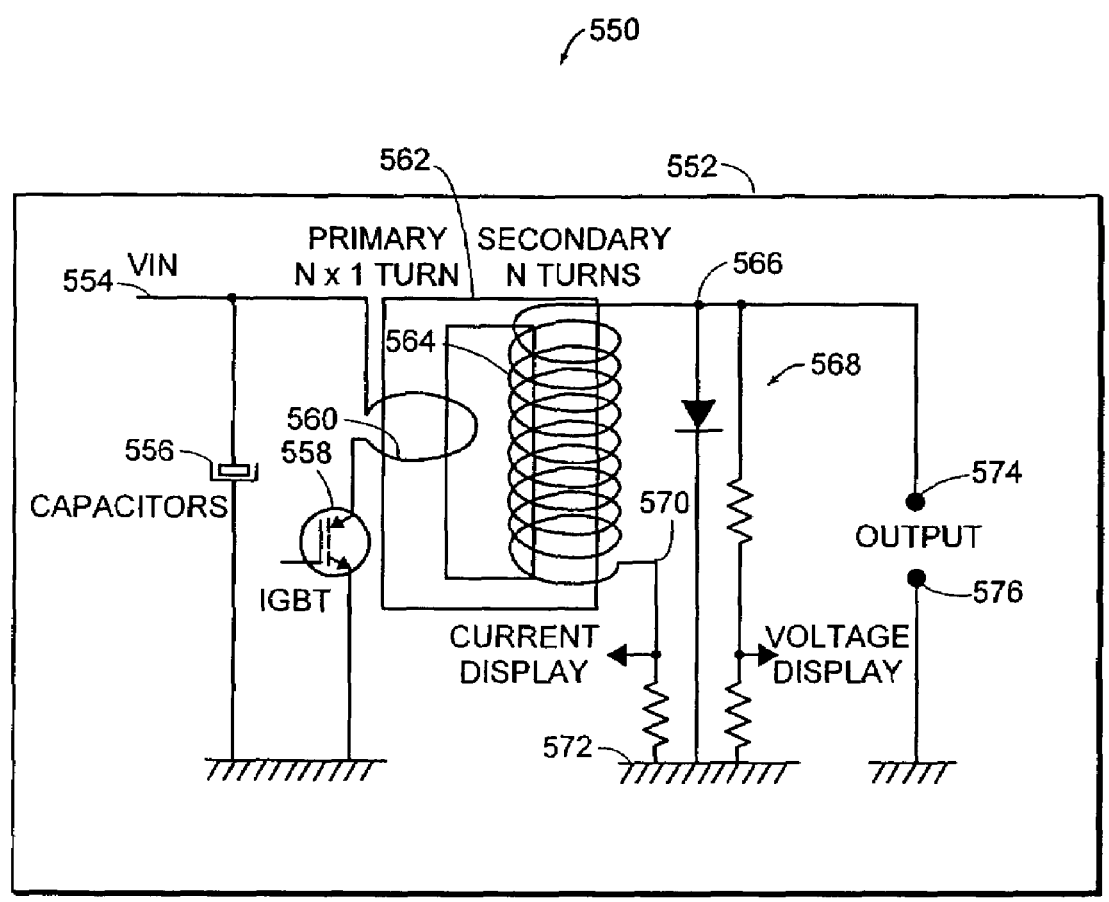
FIG. 10 illustrates a schematic diagram of a pulsed power supply that can generate multi-step voltage pulses according to the present invention.

FIG. 10 illustrates a schematic diagram 550 of a pulsed power supply 552 that can generate multi-step voltage pulses according to the present invention. The pulsed power supply 552 includes an input voltage 554 that charges a bank of capacitors 556. A parallel bank of high-power solid state switches 558, such as insulated gate bipolar transistors (IGBTs) is coupled to a primary coil 560 of a pulse transformer 562. The solid state switches 558 release energy stored in the capacitors 556 to the primary coil 560 of the pulse transformer 562.

The pulse transformer 562 also includes a secondary coil 564. The voltage gain from the pulse transformer 562 is proportional to the number of secondary turns in the secondary coil 564. A first end 566 of the secondary coil 564 is coupled to an array of driving circuits 568. A second end 570 of the secondary coil 564 is coupled to ground 572. The array of driving circuits 568 provide voltage pulses across a first output 574 and a second output 576. The first output 574 can be coupled to a cathode and the second output 576 can be coupled to an anode. The pulsed power supply 552 can provide pulse power up to about 10 MW with a relatively fast rise time.

FIG. 11 illustrates a schematic diagram 600 of a pulsed power supply 602 having a magnetic compression network 604 for supplying high-power pulses. The pulsed power supply 602 generates a long pulse with a switch and applies the pulse to an input stage of a multi-stage magnetic compression network 604. Each stage of magnetic compression reduces the time duration of the pulse, thereby increasing the power of the pulse.

The pulsed power supply 602 includes a DC supply 606, a capacitor 608, and a power-MOS solid switch 610 for providing power to the magnetic compression network 604. The magnetic compression network 604 includes four non-linear magnetic inductors 612, 614, 616, 618 and four capacitors 620, 622, 624, 626. The non-linear magnetic inductors 612, 614, 616, 618 behave as switches that are off when they are unsaturated and on when they are saturated. The magnetic compression network 604 also includes a transformer 628.

When the solid switch 610 is activated, the capacitor 620 begins to charge and the voltage V1 increases. At a predetermined value of the voltage V1, the magnetic core of the non-linear magnetic inductor 612 saturates and the inductance of the non-linear magnetic inductor 612 becomes low causing the non-linear magnetic inductor 612 to turn on. This results in charge transferring from the capacitor 608 to the capacitor 620. The electric charge stored in the capacitor 620 is then transferred through the transformer 628 to the capacitor 622 and so on. The charge that is transferred to the capacitor 626 is eventually discharged through a load 630. The magnetic compression network 604 can generate high-power pulses up to a terawatt in tens of nanoseconds with a relatively high repetition rate.

FIG. 12 illustrates a schematic diagram 650 of a pulsed power supply 652 having a Blumlein generator 654 for supplying high-power pulses. The pulsed power supply 652 having the Blumlein generator 654 can deliver short duration high voltage pulses with a fast rise time and a relatively flat top. The pulsed power supply 652 includes a high voltage DC supply 656. A first terminal 658 of the high voltage DC supply 656 is coupled through a current-limiting inductor 660 to a dielectric material 662 that is located between an inner conductor 664 and an outer conductor 666 of a coaxial cable 668. The inner conductor 664 is coupled to ground 670 through an inductance 672. The outer conductor 666 is also coupled to ground 670. In operation, the high voltage power supply 656 slowly charges the Blumlein generator 654. A very fast high-power switch 674 discharges the charge through a load 676, such as a plasma load.

Figure 13:
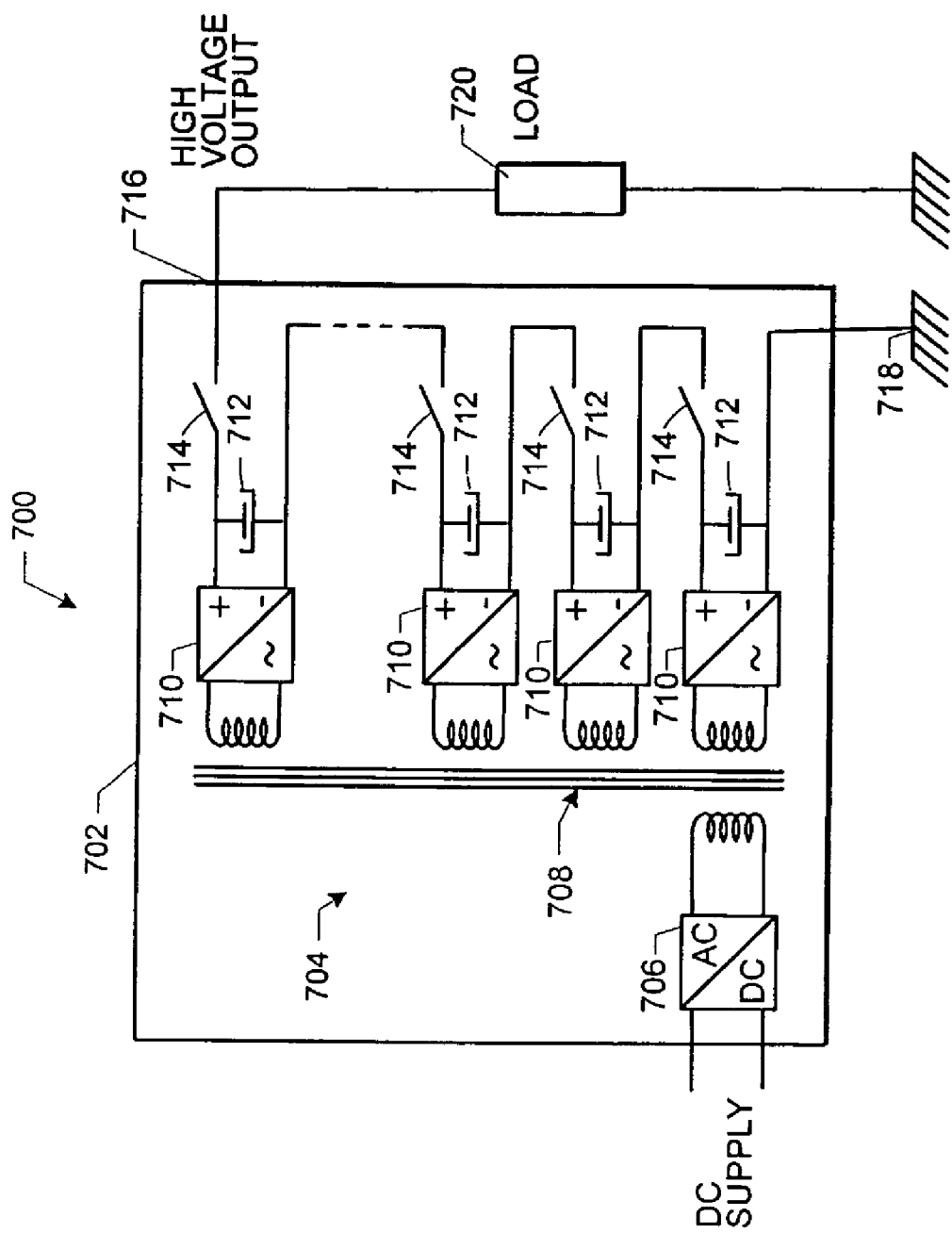
FIG. 13 illustrates a schematic diagram of a pulsed power supply having a pulse cascade generator for supplying high-power pulses.

FIG. 13 illustrates a schematic diagram 700 of a pulsed power supply 702 having a pulse cascade generator 704 for supplying high-power pulses. A high frequency power supply 706 is coupled to a transformer 708. The transformer 708 is coupled to a cascade of lower voltage (1 kV to 3 kV) pulse generators 710 that are connected in series. In operation, the high frequency power supply 706 charges capacitors 712 in each of the pulse generators 710. Switches 714 in each of the pulse generators 710 close at predetermined times thereby discharging energy in the capacitors 712. When the required output voltage appears between the terminal 716 and ground 718, the stored energy discharges through a load 720, such as a plasma load.

EQUIVALENTS

While the invention has been particularly shown and described with reference to specific preferred embodiments, it should be understood by those skilled in the art that various changes in form and detail may be made therein without departing from the spirit and scope of the invention as defined herein.

What is claimed is:

1. A pulsed power supply comprising:
   a) a voltage source that generates a voltage at an output;
   b) an energy storage device that is electrically connected to the voltage source, the voltage source charging the energy storage device to store an energy;
   c) a switching device that is electrically connected to the energy storage device, the switching device releasing the energy stored in the energy storage device when activated;
   d) a transformer comprising a primary coil that is electrically coupled to the switching device and a secondary coil, the primary coil receiving the energy stored in the energy storage device when the switch is activated and transforming the received energy to the secondary coil in order to generate multi-step voltage pulses;
   e) a driving circuit that is electrically connected to the transformer, the driving circuit forming at least one of a rise time, a fall time, a duration, and an amplitude of the multi-step voltage pulses to generate a strongly-ionized plasma; and
   f) arc suppression circuitry that reduces a probability of arcing by dropping the amplitude of the multi-step voltage pulses, thereby limiting a plasma discharge current of the strongly-ionized plasma.

2. The power supply of claim 1 wherein the switching device comprises a solid state switching device.

3. The power supply of claim 1 wherein the switching device comprises an insulated gate bipolar transistor device.

4. The power supply of claim 1 wherein at least some of the multi-step voltage pulses have predetermined shapes.

5. The power supply of claim 1 wherein at least some of the multi-step voltage pulses comprise a low-power stage and a high-power stage.

6. The power supply of claim 5 wherein the low power stage includes a first peak voltage having a magnitude and a rise time that is sufficient to generate and sustain a weakly-ionized plasma from a feed gas.

7. The power supply of claim 1 wherein at least some of the multi-step voltage pulses comprise a low-power stage, a transient stage, and a high-power stage.

8. The power supply of claim 7 wherein the transient stage includes a peak voltage having a magnitude and a rise time that is sufficient to shift an electron energy distribution in a weakly-ionized plasma to higher energies that increase an ionization rate which results in a rapid increase in electron density and a formation of a strongly-ionized plasma.

9. The power supply of claim 1 wherein at least some of the multi-step voltage pulses include low frequency voltage oscillations.

10. The power supply of claim 9 wherein an amplitude of the low frequency voltage oscillations is greater than or equal to 50 Volts.

11. The power supply of claim 1 wherein at least one of the switch and the transformer are configured to provide voltage pulses having a relatively fast rise time.

12. The power supply of claim 1 wherein the driving circuit is electrically connected to the secondary coil.

13. A pulsed power supply for generating a strongly ionized plasma, the pulsed power supply comprising:
   a) a voltage source that generates a voltage at an output;
   b) a bank of capacitors that is electrically connected to the voltage source, the voltage source charging the bank of capacitors to store an energy;
   c) a parallel bank of high-power solid state switching device that is electrically connected to the bank of capacitors, the parallel bank of high-power solid state switching device releasing the energy stored in the bank of capacitors when activated;
   d) a pulse transformer comprising a primary coil that is electrically connected to the switching device and a secondary coil, the primary coil receiving the energy stored in the bank of capacitors when the parallel bank of high-power solid state switching device is activated and transforming the received energy to multi-step voltage pulses;
   e) an array of driving circuits that is electrically connected to the pulse transformer, the array of driving circuits controlling at least one of a rise time, a fall time, a duration, and an amplitude of the multi-step voltage pulse to generate a strongly-ionized plasma; and
   f) arc suppression circuitry that reduces a probability of arcing by dropping the amplitude of the multi-step voltage pulses, thereby limiting a plasma discharge current of the strongly-ionized plasma.

14. A pulsed power supply comprising:
   a) a means for generating a voltage;
   b) a means for storing an energy;
   c) a means for releasing the stored energy at predetermined times;
   d) a means for transforming the released energy into multi-step voltage pulses;
   e) a means for controlling at least one of a rise time and a fall time of at least some of the multi-step voltage pulses to generate a strongly-ionized plasma; and
   f) a means for arc suppression that reduces a probability of arcing by dropping an amplitude of the multi-step voltage pulses, thereby limiting a plasma discharge current of the strongly-ionized plasma.

* * * * *